(12) United States Patent
Qin et al.

(10) Patent No.: US 9,628,867 B2
(45) Date of Patent: Apr. 18, 2017

(54) METHOD AND APPARATUS FOR DATA RATE CONTROLLER FOR A CODE BLOCK MULTIPLEXING SCHEME

(71) Applicant: Hughes Network Systems, LLC, Germantown, MD (US)

(72) Inventors: Liming Qin, Gaithersburg, MD (US); Marwan Adas, Broadlands, VA (US); Prachi Raikar, Germantown, MD (US); David Roos, Boyds, MD (US); Yezdi Antia, North Potomac, MD (US); Neal Becker, Frederick, MD (US)

(73) Assignee: Hughes Network Systems, LLC, Germantown, MD (US)

( * ) Notice: Subject to any disclaimer, the term of this patent is extended or adjusted under 35 U.S.C. 154(b) by 0 days.

(21) Appl. No.: 14/444,234

(22) Filed: Jul. 28, 2014

(65) Prior Publication Data

US 2014/0337896 A1  Nov. 13, 2014

Related U.S. Application Data

(60) Division of application No. 13/438,570, filed on Apr. 3, 2012, now Pat. No. 8,793,745, which is a
(Continued)

(51) Int. Cl.
*H04N 7/20* (2006.01)
*H04N 21/61* (2011.01)
(Continued)

(52) U.S. Cl.
CPC ........... *H04N 21/6143* (2013.01); *H04N 7/20* (2013.01); *H04N 21/236* (2013.01);
(Continued)

(58) Field of Classification Search
CPC ..................... H04N 21/236; H04N 21/238
(Continued)

(56) References Cited

U.S. PATENT DOCUMENTS

| 2005/0141475 A1* | 6/2005 | Vijayan ................... H04W 4/06 370/345 |
|---|---|---|
| 2009/0153747 A1* | 6/2009 | Grimes ......................... 348/731 |

(Continued)

FOREIGN PATENT DOCUMENTS

EP   2512054 A2   10/2012

OTHER PUBLICATIONS

European Search Report issued Aug. 26, 2013 for corresponding European Appln. No. 13162111.2.
(Continued)

*Primary Examiner* — Pankaj Kumar
*Assistant Examiner* — Sahar Baig
(74) *Attorney, Agent, or Firm* — K&L Gates LLP

(57) ABSTRACT

A receiver is used with third code blocks based on first code blocks, second code blocks, and a planning code block. The first code blocks are associated with a first sequence number and modulated with a first modulation scheme. The second code blocks are associated with a second sequence number and modulated with a second modulation scheme. The planning code block associates the third code blocks with the first code blocks and the second code blocks. The receiver includes a de-multiplexing portion, which includes a code block selector and a look up table, that outputs a de-multiplexed signal based on the third code blocks. The code block selector selects a code block from the third code blocks to output as the de-multiplexed signal based on entries in the look up table. The receiver also includes a recovery portion that outputs received code blocks based on the de-multiplexed signal.

15 Claims, 14 Drawing Sheets

Related U.S. Application Data continuation-in-part of application No. 13/323,467, filed on Dec. 12, 2011, and a continuation-in-part of application No. 13/086,702, filed on Apr. 14, 2011, now abandoned.

(60) Provisional application No. 61/324,085, filed on Apr. 14, 2010.

(51) Int. Cl.
| | |
|---|---|
| *H04N 21/236* | (2011.01) |
| *H04N 21/238* | (2011.01) |
| *H04N 21/2381* | (2011.01) |
| *H04N 21/2389* | (2011.01) |
| *H03M 13/11* | (2006.01) |

(52) U.S. Cl.
CPC ....... *H04N 21/238* (2013.01); *H04N 21/2381* (2013.01); *H04N 21/2389* (2013.01); *H03M 13/1165* (2013.01)

(58) Field of Classification Search
USPC .................................. 725/67, 68, 70, 100
See application file for complete search history.

(56) References Cited

U.S. PATENT DOCUMENTS

| | | | |
|---|---|---|---|
| 2010/0098047 A1* | 4/2010 | Zhou | H04L 47/10 370/345 |
| 2010/0278034 A9 | 11/2010 | Laroia et al. | |
| 2010/0313265 A1* | 12/2010 | Lin et al. | 726/22 |
| 2011/0090975 A1* | 4/2011 | Al-Naffouri et al. | 375/260 |
| 2011/0110315 A1 | 5/2011 | Chen et al. | |
| 2011/0149770 A1 | 6/2011 | Cimini, Jr. et al. | |
| 2011/0200088 A1 | 8/2011 | Koslov et al. | |
| 2011/0206148 A1 | 8/2011 | Al-Naffouri et al. | |
| 2011/0258669 A1 | 10/2011 | Antia et al. | |
| 2013/0170424 A1 | 7/2013 | Anchan et al. | |

OTHER PUBLICATIONS

European Office Action issued Aug. 12, 2015 for corresponding European Appln. No. 13162111.2 (5 pages).
European Office Action issued Mar. 24, 2016 for corresponding European Appln. No. 13162111.2 (5 pages).

* cited by examiner

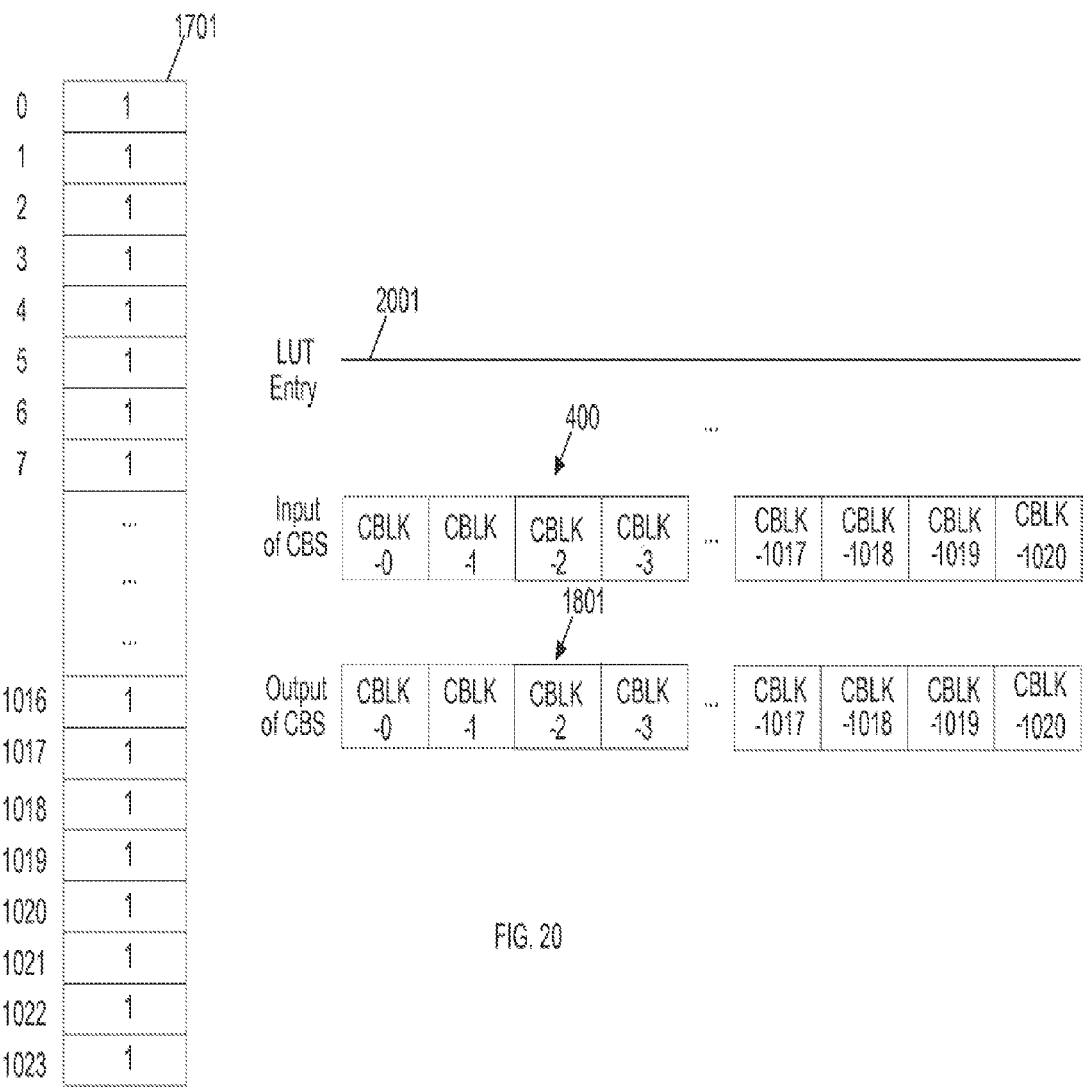

METHOD AND APPARATUS FOR DATA RATE CONTROLLER FOR A CODE BLOCK MULTIPLEXING SCHEME

The present application is a divisional of U.S. patent application Ser. No. 13/438,570 filed Apr. 3, 2012, now U.S. Pat. No. 8,793,745, which is a continuation-in-part of U.S. patent application Ser. No. 13/323,467 filed Dec. 12, 2011, now U.S. Pat. No. 9,264,675, and a continuation-in-part of U.S. application Ser. No. 13/086,702 filed Apr. 14, 2011, both of which claim priority to U.S. Provisional Application No. 61/324,085 filed Apr. 14, 2010, the entire disclosures of each of which are incorporated by reference herein.

BACKGROUND

Transportation of higher throughput advanced services via a satellite transponder has been an engineering design constraint for decades. The transmission system and receiver system are main two areas of a satellite broadcast system. High capacity data services over satellite are among the primary technology challenges facing the industry and satellite system operators today. Digital video broadcast-satellite second generation (DVB-S2) is an enhanced specification for satellite digital television broadcast developed in 2003 and ratified in March 2005. Using the traditional mechanism over the standard DVB-S2, meeting the high bandwidth and interactive services requires significantly higher satellite transponders to support data rates.

FIG. 1 illustrates an example conventional transmitter.

As illustrated in the figure, a transmitter 100 includes a code rate organizer (CRO) 102, a modulator 104, a match filter 106 and a digital-to-analog converter (DAC) 108.

CRO 102 may be arranged to receive an outroute stream signal 110 and output a signal 112. Modulator 104 may be arranged to receive signal 112 and output a modulated signal 114. Match filter 106 may be arranged to receive modulated signal 114 and output a transmit signal 116. DAC 108 may be arranged to receive transmit signal 116 and output an analog signal 118.

CRO 102 may determine the modulation and coding to be performed for outroute stream signal 110 in order to generate output signal 112. CRO 102 may perform coding for information to be communicated to remote receivers (not shown) as addressed by outroute stream signal 110.

Modulator 104 may encode received signal 112 and output modulated signal 114. Modulator 104 may code a digital data input payload for ensuring a receive terminal can decode and perform error correction for errors occurring in a received payload.

Match filter 106 may perform filtering in order to maximize the signal-to-noise ratio of a signal in the presence of an additive noise.

DAC 108 may convert digital modulated transmit signal 116 to analog signal 118.

In operation, CRO 102 may receive and perform coding for received signal outroute stream signal 110. Modulator 104 may receive signal 112 and perform forward error correction and modulation. Match filter 106 may receive signal which has been coded, forward error corrected and modulated and perform filtering on the received signal in order to maximize the signal-to-noise ration of the signal in the presence of additive noise. Finally, DAC 108 may convert the coded, forward error corrected, modulated and filtered signal into an analog continuous waveforms for transmission.

In a conventional satellite system, data streams may be coded, modulated and broadcast to a multiplicity of mobile terminals. A typical conventional transmitter can receive a signal with up to 45 million symbols per second (Msps). However, in order to meet the demand for today's high definition and advanced services, terminals may be required to support significantly more than the 45 Msps. To achieve high data rates, for example up to 220 Msps, needed by the satellite communications industry using conventional techniques would require expensive equipment with significantly high power consumption.

What is needed is a system and method to increase the efficiency and address the challenges of transmitting high quality video and advanced services via satellite in a cost effective manner while adhering to low power consumption constraints.

BRIEF SUMMARY

The present invention provides, a system and method to increase the efficiency and address the challenges of transmitting high quality video, advanced services via satellite in a cost effective manner while adhering to low power consumption constraints.

In accordance with an aspect of the present invention, a transmitter may be provided for use with a first input signal and a second input signal. The transmitter includes a first modulating portion, a second modulating portion and a multiplexing portion. The first modulating portion can output a first plurality of code blocks based on the first input signal, wherein each of the first plurality of code blocks has a first sequence number associated therewith and may be modulated with a first modulation scheme. The second modulating portion can output a second plurality of code blocks based on the second input signal, wherein each of the second plurality of code blocks has a second sequence number associated therewith and may be modulated with a second modulation scheme, and wherein the second modulation scheme may be different than the first modulation scheme. The multiplexing portion can a third plurality of code blocks based on the first plurality of code blocks, the second plurality of code blocks and planning code block. The planning code block associates each of the third plurality of code blocks with a respective one of the first plurality of code blocks and the second plurality of code blocks.

In accordance with another aspect of the present invention, a receiver may be provided for use with a third plurality of code blocks based on a first plurality of code blocks, a second plurality of code blocks and planning code block. The first plurality of code blocks may be based on a first input signal. The second plurality of code blocks may be based on a second input signal. Each of the first plurality of code blocks has a first sequence number associated therewith and may be modulated with a first modulation scheme. Each of the second plurality of code blocks has a second sequence number associated therewith and may be modulated with a second modulation scheme. The second modulation scheme may be different than the first modulation scheme. The planning code block associates each of the third plurality of code blocks with a respective one of the first plurality of code blocks and the second plurality of code blocks. The receiver includes a de-multiplexing portion and a recovery portion. The de-multiplexing portion can output a de-multiplexed signal based on the third plurality of code blocks. The recovery portion can output a plurality of received code blocks based on the de-multiplexed signal.

Each of the plurality of received code blocks may be modulated with the first modulation scheme. The plurality of received code blocks includes the first plurality of code blocks and the planning code block.

In accordance with another aspect of the present invention, a receiver is provided for use with a third plurality of code blocks based on a first plurality of code blocks, a second plurality of code blocks and planning code block. The first plurality of code blocks may be based on a first input signal. The second plurality of code blocks may be based on a second input signal. Each of the first plurality of code blocks has a first sequence number associated therewith and may be modulated with a first modulation scheme. Each of the second plurality of code blocks has a second sequence number associated therewith and may be modulated with a second modulation scheme. The second modulation scheme may be different than the first modulation scheme. The planning code block associates each of the third plurality of code blocks with a respective one of the first plurality of code blocks and the second plurality of code blocks. The receiver includes a recovery portion and a de-multiplexing portion. The recovery portion can output a plurality of received code blocks based on the third plurality of code blocks. The de-multiplexing portion can output a de-multiplexed signal based on the plurality of received code blocks. Each of the plurality of received code blocks may be modulated with the first modulation scheme. The plurality of received code blocks includes the first plurality of code blocks and the planning code block.

Additional advantages and novel features of the invention are set forth in part in the description which follows, and in part will become apparent to those skilled in the art upon examination of the following or may be learned by practice of the invention. The advantages of the invention may be realized and attained by means of the instrumentalities and combinations particularly pointed out in the appended claims.

BRIEF SUMMARY OF THE DRAWINGS

The accompanying drawings, which are incorporated in and form a part of the specification, illustrate an exemplary embodiment of the present invention and, together with the description, serve to explain the principles of the invention. In the drawings:

FIG. 19 illustrates an exemplary look up table that passes every codeblock for processing.

FIG. 20 illustrates exemplary input and output of a code block selector that references a look up table that passes every code block for processing.

DETAILED DESCRIPTION

In accordance with an aspect of the present invention, a plurality of outroute data streams may be multiplexed at the transmitter side, thereby achieving multiple times greater data capacity than existing transmitters. Similarly, a received multiplexed data stream may be de-multiplexed at the receiver side in order to achieve greater data capacity.

In an example embodiment, a transmitter has a four outroute streams, multiplexed into one 220 Msps outroute stream. The outroute streams may be multiplexed with either a Time Division Multiplexing (TDM) scheme or a Code Division Multiplexing (CDM) scheme, that can be sent over the satellite system. Before being multiplexed, each outroute stream may be coded with a relatively low rates, for example 55 Msps. Example transmitters in accordance with aspects of the present invention will now be described with reference to FIGS. 2-4.

Figure 2:
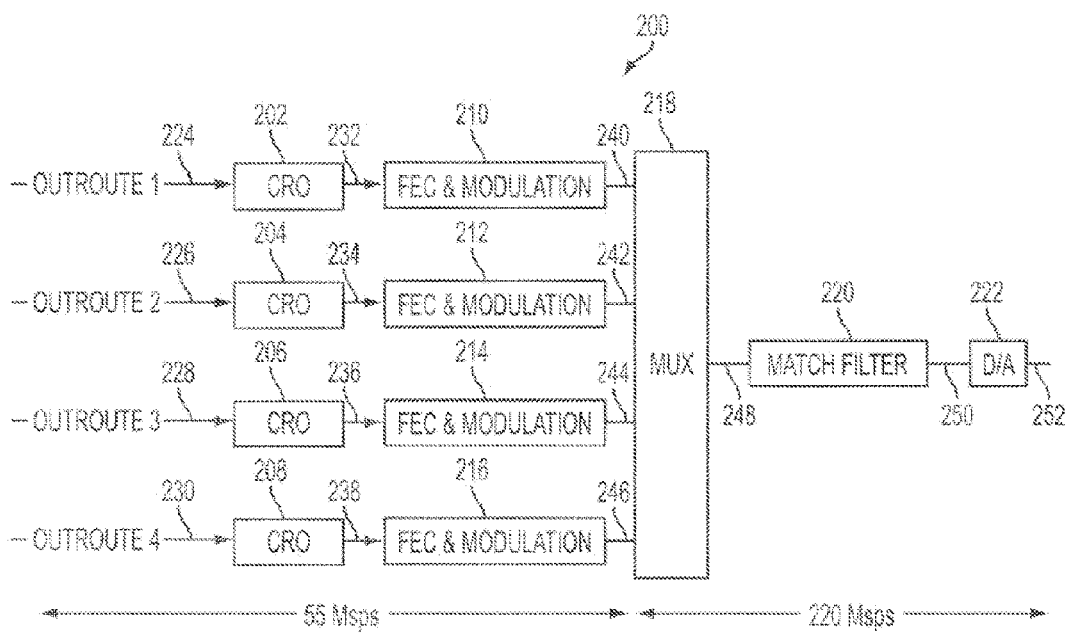
FIG. 2 illustrates an example transmitter in accordance with an aspect of the present invention.

FIG. 2 illustrates an example transmitter, in accordance with an aspect of the present invention.

A transmitter 200 includes a CRO 202, a CRO 204, a CRO 206, a CRO 208, a modulator 210, a modulator 212, a modulator 214, a modulator 216, a multiplexer 218, a match filter 220 and a DAC 222.

CRO 202 may be arranged to receive an outroute stream signal 224 and output a signal 232. Modulator 210 may be arranged to output a modulated signal 240 based on signal 232. In some embodiments, modulator 210 is arranged to receive signal 232 directly from CRO 202. Similarly, CRO 204 may be arranged to receive an outroute stream signal 226 and output a signal 234. Modulator 212 may be arranged to output a modulated signal 242 based on signal 234. In some embodiments, modulator 212 is arranged to receive signal 234 directly from CRO 204. CRO 206 may be arranged to receive an outroute stream signal 228 and output a signal 236. Modulator 214 may be arranged to output a modulated signal 244 based on signal 236. In some embodiments, modulator 214 is arranged to receive signal 236 directly from CRO 206. CRO 208 may be arranged to receive an outroute stream signal 230 and output a signal 238. Modulator 216 may be arranged to output a modulated signal 246 based on signal 238. In some embodiments, modulator 216 is arranged to receive signal 238 directly from CRO 208.

Multiplexer 218 may be arranged to output a multiplexed signal 248 based on modulated signals 240, 242, 244 and 246. In some embodiments, multiplexer 218 is arranged to receive modulated signals 240, 242, 244 and 246 directly from modulator 210, modulator 212, modulator 214 and modulator 216, respectively. Match filter 220 may be arranged to output a filtered signal 250 based on multiplexed signal 248. Non-limiting examples of modulation types supported by filtered signal 250 include TDM and CDM. In some embodiments, match filter 220 is arranged to receive multiplexed signal 248 directly from multiplexer 218. A match filter, on the transmitter side, is used to limit the bandwidth and reduce adjacent channel interference. On a corresponding receiver side (not shown), a match filter is used as an optimal linear filter for maximizing the signal to noise ratio in the presence of noise. DAC 222 may be arranged to output an analog signal 252 based on filtered signal 250. In some embodiments, DAC 222 is arranged to receive filtered signal 250 directly from match filter 220.

Figure 1:
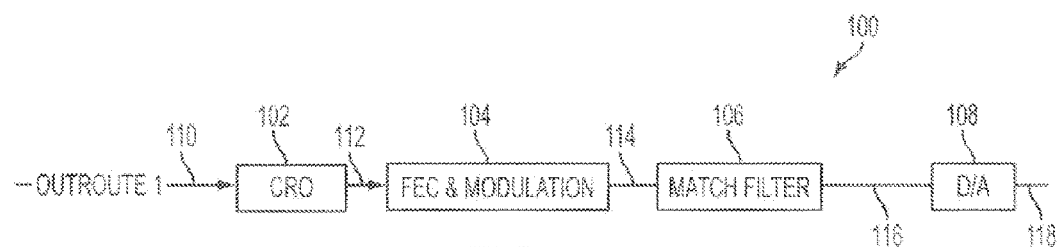
FIG. 1 illustrates an example conventional transmitter.

CRO 202, CRO 204, CRO 206 and CRO 208 may perform modulation and coding of outroute stream signals 224, 226, 228 and 230, respectively, and output coded signals 232, 234, 236 and 238, respectively, in a manner similar to CRO 102 of FIG. 1. Modulators 210, 212, 214 and 216, receive and encode and bit-to-symbol map coded signals 232, 234, 236 and 238, respectively, and output modulated signals 240, 242, 244 and 246, respectively, in a manner similar to modulator 104 of FIG. 1.

Multiplexer 218 multiplexes modulated signals 240, 242, 244 and 246 into one outroute stream as denoted by multiplexed signal 248. By multiplexing modulated signals 240, 242, 244 and 246 into one outroute stream, transmitter 200 is able to utilize a single device or resource, in this case DAC 222, to transmit a plurality of signals. Match filter 220 may filter multiplexed signal 248 in order to maximize the signal-to-noise ratio of the transmitted signal, in a similar manner as discussed above with reference to match filter 106 of FIG. 1. DAC 222 may convert transmit filtered signal 250 to analog signal 252.

Each pair of CRO 202 and modulator 210, CRO 204 and modulator 212, CRO 206 and modulator 214, and CRO 208 and modulator 216 may operate in a similar manner as the pair of CRO 102 and modulator 104 as discussed above with reference to FIG. 1. For purposes of discussion, presume that each pair of CRO 202 and modulator 210, CRO 204 and modulator 212, CRO 206 and modulator 214, and CRO 208 and modulator 216 may operate at a rate of 55 Msps, similar to the conventional transmitter discussed above with reference to FIG. 1.

In contrast with the conventional system discussed above with reference to FIG. 1, in accordance with an aspect of the present invention, multiplexer 218 may operate at a much higher rate. For purposes of explanation, presume that in this example embodiment, multiplexer 218, match filter 220 and DAC 222 may operate at a rate of 220 Msps. The 220 Msps performance of multiplexed signal 248 represents the aggregation of four 55 Msps as denoted by modulated signal 240, 242, 244 and 246. Multiplexed signal 248 may then be processed via match filter 220 to generate transmit filtered signal 250. Match filter 220 may operate in a similar manner as match filter 106 as discussed with reference to FIG. 1, however at a significantly increased rate of operation. DAC 222 may convert transmit filtered signal 250 into analog which may then transmitted as analog signal 252. DAC 222 may operate in a similar manner as DAC 108 as discussed above with reference to FIG. 1, however at a significantly higher rate of operation.

In accordance with a multiplexed arrangement of the present invention, a plurality of outroute streams may be modulated, each at a conventional rate. Then the plurality of modulated outroute streams may be multiplexed together, filtered and converted into analog signals at a much higher rate. Accordingly, the overall data throughput provided by a transmitter in accordance with the present invention is much greater than that of a conventional transmitter as a result of aggregating multiple conventional information streams into an aggregate information stream performing at a significantly higher rate of operation.

Figure 3:
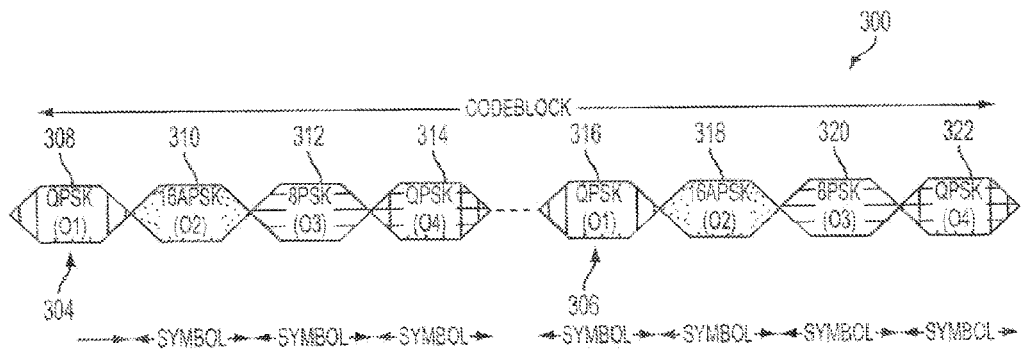
FIG. 3 illustrates an example plurality of data symbols having different modulation schemes and formed into a single codeblock.

FIG. 3 illustrates an example codeblock entering into multiplexer 218, in accordance with an aspect of the present invention.

As illustrated in the figure, a codeblock 300 includes a sub-stream 304, a plurality of additional portions illustrated with a series of dots and a sub-stream 306. Sub-stream 304 includes a symbol 308, a symbol 310, a symbol 312 and a symbol 314. Sub-stream 306 includes a symbol 316, a symbol 318, a symbol 320 and a symbol 322.

In this example, presume that symbol 308 and symbol 316 correspond to two consecutive symbols within outroute sub-stream signal 224 of FIG. 2 and have been modulated with a QPSK modulation scheme. In this example, presume that symbol 310 and symbol 318 correspond to two consecutive symbols within outroute sub-stream signal 226 and have been modulated with a 16APSK modulation scheme. In this example, presume that each of symbol 312 and symbol 320 correspond to two consecutive symbols within outroute sub-stream signal 228 and have been modulated with an 8PSK modulation scheme. In this example, presume that each of symbol 314 and symbol 322 correspond to two consecutive symbols within outroute sub-stream signal 230 and have been modulated with a QPSK modulation scheme.

In operation, multiplexer 218 first receives a symbol of modulated signal 240 as symbol 308. Multiplexer 218 receives a symbol of modulated signal 242 as symbol 310. Multiplexer 218 then receives a symbol of modulated signal 244 as symbol 312. Then multiplexer 218 receives a symbol of modulated signal 246 as symbol 314. Multiplexer 218 continues to receive modulated signals 240, 242, 244 and 246 until codeblock 300 is completely transmitted, ending with the receipt of symbols 316, 318, 320 and 322, corresponding to modulated signals 240, 242, 244 and 246, respectively.

Figure 4:
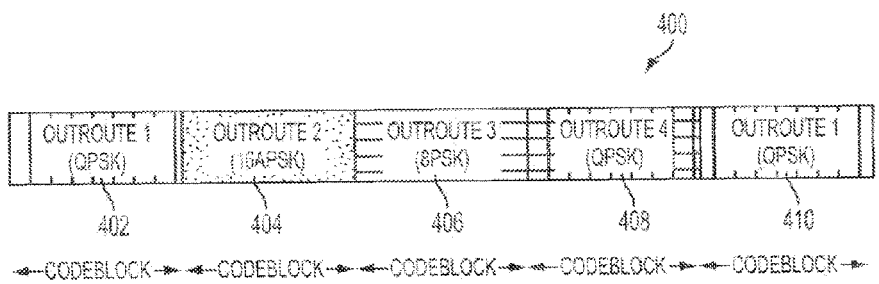
FIG. 4 illustrates an example of individual codeblocks arranged into a TDM codeblock data stream.

FIG. 4 illustrates an example TDM codeblock data stream 400 leaving multiplexer 218, in accordance with an aspect of the present invention.

As illustrated in FIG. 4, TDM codeblock data stream 400 includes an outroute codeblock 402, an outroute codeblock 404, an outroute codeblock 406, an outroute codeblock 408 and an outroute codeblock 410.

Outroute codeblocks 402 and 410 are denoted as having been modulated via QPSK. Outroute codeblock 404 is denoted as having been modulated via 16APSK. Outroute codeblock 406 is denoted as having been modulated via 8APSK. Outroute codeblock 408 is denoted as having been modulated via QPSK. It should be noted that an output stream may have a plurality of codeblocks that have been modulated with different types of modulation schemes. For example, although in this example, outroute codeblocks 402 and 410 are each in outroute stream 1 and are denoted as having been modulated via QPSK, in other examples, outroute stream 1 may have outroute codeblocks that have been modulated via other modulation schemes.

In order to reduce complexity, cost and power consumption, a receiver may perform selective reception. For purposes of discussion, presume that four receivers are arranged to receive a signal transmitted from transmitter 200. For example, a first receiver may receive and reassemble the QPSK codeblock of outroute stream signal 224 of FIG. 2, which correspond to a sampling denoted by example outroute codeblocks 402 and 410 of FIG. 4. The first receiver may ignore the other codeblocks that do not correspond to outroute stream signal 224, for example a sampling denoted by example outroute codeblocks 404, 406 and 408. Similarly, a second receiver may receive and reassemble the 16APSK codeblock of outroute stream signal 226 of FIG. 2, which correspond to a sampling denoted by example outroute codeblock 404 of FIG. 4. The second receiver may ignore the other codeblocks that do not correspond to outroute stream signal 226, for example a sampling denoted by example outroute codeblocks 402, 406, 408 and 410. Further, a third receiver may receive and reassemble the 8PSK codeblock of outroute stream signal 228 of FIG. 2, which correspond to a sampling denoted by example outroute codeblock 406 of FIG. 4. The third receiver may ignore the other codeblocks that do not correspond to outroute stream signal 228, for example a sampling denoted by example outroute codeblocks 402, 404, 408 and 410. Finally, a fourth receiver may receive and reassemble the QPSK codeblock of outroute stream signal 230 of FIG. 2, which correspond to a sampling denoted by example outroute codeblock 408 of FIG. 4. The fourth receiver may ignore the other codeblocks that do not correspond to outroute stream signal 230, for example a sampling denoted by example outroute codeblocks 402, 404, 406 and 410.

Again, in accordance with an aspect of the present invention, a single transmitter is operable to transmit a single data stream that includes a plurality of outroute codeblocks that have been multiplexed together. A single receiver will be able to receive the entire single data stream. For efficient processing, the receiver will only process a portion of the entire received single data stream. This aspect of the present invention will now be described with reference to FIG. 5.

Figure 5:
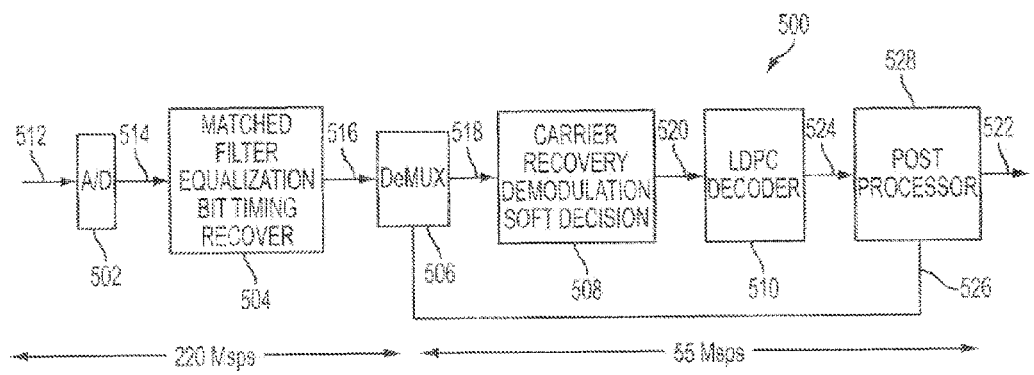
FIG. 5 illustrates an example receiver that ensures faster processing and higher data rates in accordance with an aspect of the present invention.

FIG. 5 illustrates an example receiver, in accordance with an aspect of the present invention.

A receiver 500 includes an analog-to-digital converter (ADC) 502, a match filter equalizer 504, a de-multiplexer 506, a demodulator 508, a low density parity check (LDPC) decoder 510 and a post processor 528.

ADC 502 may be arranged to receive an analog signal 512 from transmitter 200 and to output a digital signal 514. Match filter equalizer 504 may be arranged to output a digital signal 516 based on digital signal 514. In some embodiments, match filter equalizer 504 is arranged to receive digital signal 514 directly from ADC 502. De-multiplexer 506 may be arranged to output a de-multiplexed signal stream 518 based on digital signal 516 and a data signal 526. In some embodiments, de-multiplexer 506 is arranged to receive digital signal 516 directly from match filter equalizer 504. In some embodiments, de-multiplexer 506 is arranged to receive data signal 526 directly from post processor 528. Demodulator 508 may be arranged to output a demodulated signal 520 based on de-multiplexed signal stream 518. In some embodiments, demodulator 508 is arranged to receive de-multiplexed signal stream 518 directly from de-multiplexer 506. LDPC decoder 510 may be arranged to output a decoded signal 524 based on demodulated signal 520. In some embodiments, LDPC decoder 510 is arranged to receive demodulated signal 520 directly from demodulator 508. Post processor 528 may be arranged to output a data signal 522 and data signal 526, each based on decoded signal 524. In an example embodiment, post processor 528 is arranged to receive decoded signal 524 directly from LDPC decoder 510.

ADC 502 converts received analog signals transmitted from an analog format to a digital format. Match filter equalizer 504 performs matched filtering of digital signal 514 in order to maximize the signal-to-noise ratio of the received signal. Furthermore, match filter equalizer 504 may perform recovery of bit timing. De-multiplexer 506 may select the portions of the received signal for processing. Demodulator 508 performs demodulation of the symbols selected by de-multiplexer 506 to form a reassembled codeblock. LDPC decoder 510 may decode of the received signal. Post processor 528 may provide timeplan information to de-multiplexer 506 such that de-multiplexer 506 may select the correct codeblocks for delivery to demodulator 508. The timeplan information will be described in greater detail below.

In operation, receiver 500 receives analog signal 512. After ADC 502 converts analog signal 512 to digital signal 514, match filter equalizer 504 filters digital signal 514 to maximize the signal-to-noise ratio and thus improve signal quality. Match filter equalizer 504 may also operate to perform bit timing recovery in order to determine the starting and ending times for received symbols. De-multiplexer 506 then selects the portions of digital signal 516 for processing. For example, as described with reference to FIG. 3 and FIG. 4, de-multiplexer 506 may select to pass symbol 308 and symbol 316 via digital signal 516 and reject other symbols. Demodulator 508 performs demodulation of the symbols selected by de-multiplexer 506 to form a reassembled codeblock. For example, as described with reference to FIG. 3 and FIG. 4, a multiplicity of symbols with a sampling denoted as symbol 308 and symbol 316 may be reassembled to form the codeblock denoted as outroute codeblock 402. De-multiplexed signal stream may then be processed into original streams delivered to LDPC decoder 510 for decoding. LDPC codes may be defined as Low Density Parity Codes and having an easily parallelizable decoding algorithm, performing simple arithmetic operations suitable for iterative decoding. Post processor 528 may receive the digitized, filtered, de-multiplexed, demodulated, reassembled and decoded signal for error detection and timeplan management.

As will be described in more detail below, analog signal 512 will include a timeplan indicating which codeblocks receiver 500 should decode. Post processor 528 will use this information to instruct de-multiplexer 506 as to which portions of digital signal 516 to pass for processing.

In order to reduce complexity, cost and power consumption, receiver 500 may perform selective reception. For purposes of discussion, presume that receiver 500 is intended to receive and reassemble the 16APSK symbols of outroute stream signal 226 of FIG. 2, which correspond to a sampling denoted by example outroute codeblock 404 of FIG. 4. Receiver 500 may ignore the other symbols that do not correspond to outroute stream signal 226, for example a sampling denoted by example outroute codeblocks 402, 406, 408 and 410.

In accordance with a multiplexed arrangement of the present invention, a single received stream that includes a plurality of outroute streams may be de-multiplexed at a very high rate. Then the single batch of codeblocks selected by the multiplexer may be demodulated, decoded and processed at a much lower rate. Accordingly, the overall data processed by a receiver in accordance with the present invention may be similar to that of a conventional transmitter even though the received signal is received at a significantly higher rate. In other words, in accordance with an aspect of the present invention, a single transmitter is operable to transmit a single data stream that includes a plurality of outroute codeblocks that have been multiplexed together. Receiver 500 will be able to receive the entire single data stream. For efficient processing, receiver 500 will only process a portion of the entire received single data stream.

In the example embodiment discussed above with reference to FIG. 5, a received signal is de-multiplexed and is then demodulated. However, in other embodiments, a received signal may first be demodulated and then de-multiplexed. This will now be described in greater detail below with reference to FIG. 6.

Figure 6:
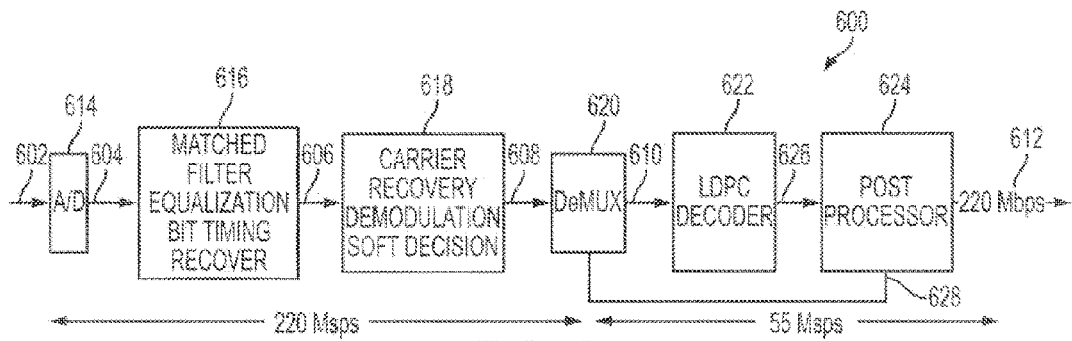
FIG. 6 illustrates another example receiver that accommodates slow processing and faster data rates in accordance with an aspect of the present invention.

FIG. 6 illustrates an example receiver with carrier recovery performed prior to the de-multiplexer in accordance with an aspect of the present invention.

As illustrated in the figures, a receiver 600 includes an ADC 614, a match filter equalizer 616, a demodulator 618, a de-multiplexer 620, a LDPC decoder 622 and a post processor 624.

ADC 614 may be arranged to receive an analog signal 602 from satellite transmitter 200 and to output a digital signal 604. Match filter equalizer 616 is arranged output a recovered signal 606 based on digital signal 604. In some embodiments, match filter equalizer 616 is arranged to receive digital signal 604 directly from ADC 614. Demodulator 618 is arranged to output a demodulated signal 608 based on recovered signal 606. In some embodiments, demodulator 618 is arranged to receive recovered signal 606 directly from match filter equalizer 616. De-multiplexer 620 may be arranged to output a de-multiplexed signal stream 610 based on demodulated signal 608 and a feedback signal 628. In some embodiments, de-multiplexer 620 is arranged to receive demodulated signal 608 directly from demodulator 618. In some embodiment, de-multiplexer 620 is arranged to receive feedback signal 628 directly from post processor 624. LDPC decoder 622 may be arranged to output a decoded data signal 626 based on de-multiplexed signal stream 610. In some embodiments, LDPC decoder 622 is arranged to receive de-multiplexed signal stream 610 directly from de-multiplexer 620. Post processor 624 may be arranged to output a data signal 612 based on decoded data signal 626 and also to deliver timeplan information via feedback signal 628 based on decoded data signal 626. In some embodiments, post processor 624 is arranged to receive decoded data signal 626 directly from LDPC decoder 622.

ADC 614 may convert received analog signals transmitted from a satellite to digital format for further processing in a similar manner to ADC 502 as discussed above with reference to FIG. 5. Match filter equalizer 616 may filter digital signal 604 in order to maximize the signal-to-noise ratio of the received signal. Furthermore, match filter equalizer 616 may perform bit timing recovery. Match filter equalizer 616 may operate in a similar manner as match filter equalizer 504 as discussed above with reference to FIG. 5. Demodulator 618 may perform demodulation of recovered signal 606 and may operate in a similar manner as demodulator 508 as discussed above with reference to FIG. 5, except demodulator 618 may operate as a significantly higher rate than demodulator 508. De-multiplexer 620 may recover the carrier signal and reassemble the digitized, filtered and demodulated received signal into the recovered de-multiplexed signal stream 610. Furthermore, de-multiplexer 620 may operate in a similar manner to de-multiplexer 506 as discussed above with reference to FIG. 5. LDPC decoder 622 performs decoding for recovery of the originally transmitted information, with exception for performing error detection/correction. LDPC decoder 622 may operate in a similar manner to LDPC decoder 510 as discussed above with reference to FIG. 5. Post processor 624 may perform error detection and for generating timeplan information for delivery to De-multiplexer 620. Post processor 624 may operate in a similar manner to post processor 528 as discussed above with reference to FIG. 5.

A difference between the embodiment discussed above with reference to FIG. 5 and the embodiment discussed above with reference to FIG. 6 is the placement of the de-multiplexer with respect to the demodulator. In the embodiment discussed above with reference FIG. 5, de-multiplexer 506 is arranged prior to demodulator 508. On the other hand, in the embodiment discussed above with reference to FIG. 6, de-multiplexer 620 is arranged after demodulator 618.

Compared to receiver 500, receiver 600 in operation may require greater complexity, power consumption and processor utilization, and as a result, a higher cost.

As described with reference to FIGS. 3-6, a plurality of streams of information may be assembled and transmitted at a high rate from a single transmitter to a plurality of receivers. The information destined for a single receiver may be a portion of the information as transmitted by the transmitter. The assembly of the transmitted information and the configuration of the receiver enable a portion of the receiver to operate at a reduced rate, with an overall lower power consumption and cost.

The examples as discussed above with reference to FIGS. 3-6 were performed based upon time division multiplexing. However, in accordance with another aspect of the present invention, other types of multiplexing may be used. For example, a transmitter and receiver may be configured where the multiplexing scheme may be based upon code division multiplexing (CDM). CDM employs a special coding scheme, wherein each receiver is assigned a code, to allow multiple users to be multiplexed over the same physical channel. An embodiment using CDM will now be discussed with reference to FIG. 7.

Figure 7:
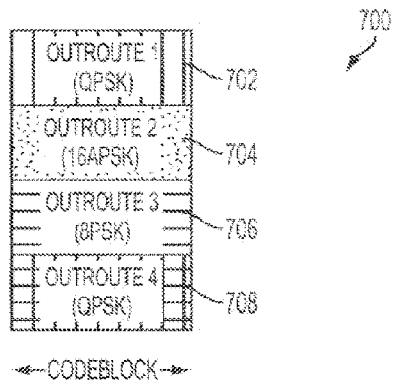
FIG. 7 illustrates an example code division multiplexed codeblock.

FIG. 7 illustrates an example CDM codeblock 700.

As illustrated in the figure, CDM codeblock 700 includes an outroute 702, an outroute 704, an outroute 706 and an outroute 708.

Outroute 702 may be a QPSK modulated bit stream packet and configured as a portion of CDM codeblock 700. Outroute 704 may be a 16APSK modulated bit stream packet and configured as a portion of CDM codeblock 700. Outroute 706 may be an 8PSK modulated bit stream packet and configured as a portion of CDM codeblock 700. Outroute 708 may be a QPSK modulated bit stream packet and configured as a portion of CDM codeblock 700.

Outroutes 702, 704, 706 and 708 may be transmitted simultaneously via a single channel. A bit of information to be transmitted may be translated into a code represented by a multiplicity of bits. The outroutes may have differing and orthogonal codes. The translated orthogonal codes for the various outroutes allows for discrimination between the codes by a receiver or receivers.

In operation, individual outroute data streams may be modulated utilizing CDM scheme. Modulated CDM codeblock 700, an aggregate of outroutes 702, 704, 706 and 708, may be processed from outroute stream signals 224, 226, 228 and 230.

Figure 8:
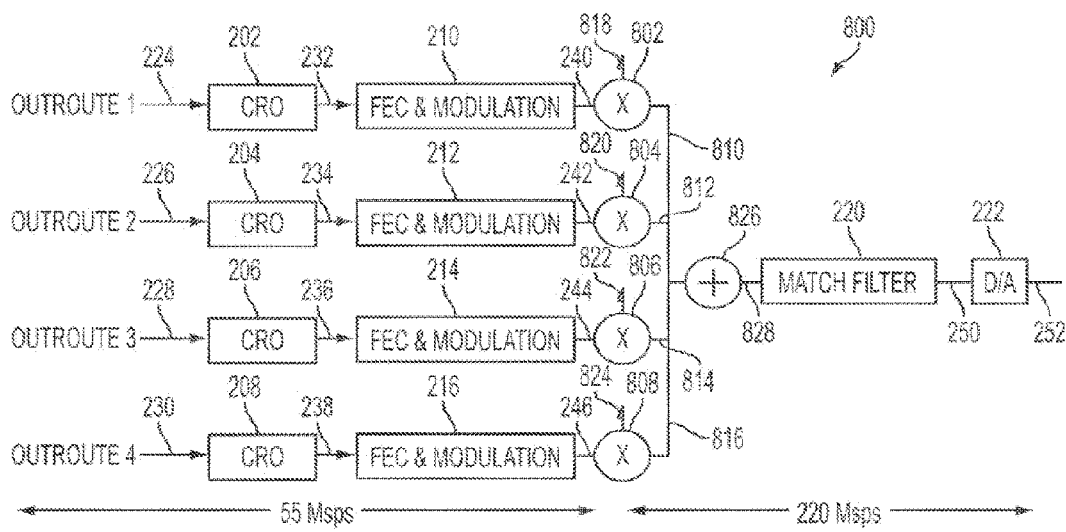
FIG. 8 illustrates another example transmitter using low cost multiplier circuits in accordance with an aspect of the present invention.

FIG. 8 illustrates an example transmitter performing transmission of codeblocks via CDM modulation as described with reference to the FIG. 7, in accordance with an aspect of the present invention.

A transmitter 800 includes CRO 202, CRO 204, CRO 206, CRO 208, modulator 210, modulator 212, modulator 214, modulator 216, match filter 220, DAC 222, a multiplier 802, a multiplier 804, a multiplier 806, a multiplier 808 and an adder 826.

CRO 202 may be arranged to receive outroute stream signal 224 and output signal 232. Modulator 210 may be arranged to output modulated signal 240 based on signal 232. In some embodiments, modulator 210 is arranged to receive signal 232 directly from CRO 202. Similarly, CRO 204 may be arranged to receive outroute stream signal 226 and output signal 234. Modulator 212 may be arranged to output modulated signal 242 based on signal 234. In some embodiments, modulator 212 is arranged to receive signal 234 directly from CRO 204. CRO 206 may be arranged to receive outroute stream signal 228 and output signal 236. Modulator 214 may be arranged to output modulated signal 244 based on signal 236. In some embodiments, modulator 214 is arranged to receive signal 236 directly from CRO 206. CRO 208 may be arranged to receive outroute stream signal 230 and output signal 238. Modulator 216 may be arranged to output modulated signal 246 based on signal 238. In some embodiments, modulator 216 is arranged to receive signal 238 directly from CRO 208.

Multiplier 802 is arranged to output a code multiplied signal 810 based on a code 818 and modulated signal 240. In some embodiments, multiplier 802 is arranged to receive modulated signal 240 directly from modulator 210. Multiplier 804 is arranged to output a code multiplied signal 812 based on a code 820 and modulated signal 242. In some embodiments, multiplier 804 is arranged to receive modulated signal 242 directly from modulator 212. Multiplier 806 is arranged to output a code multiplied signal 814 based on a code 822 and modulated signal 244. In some embodiments, multiplier 806 is arranged to receive modulated signal 244 directly from modulator 214. Multiplier 808 is arranged to output a code multiplied signal 816 based on a code 824 and modulated signal 246. In some embodiments, multiplier 808 is arranged to receive modulated signal 246 directly from modulator 216.

Adder 826 may be arranged to output a CDM signal 828 based on code multiplied signals 810, 812, 814 and 816. In some embodiments, adder 826 is arranged to receive code multiplied signal 810 directly from multiplier 802. In some embodiments, adder 826 is arranged to receive code multiplied signal 812 directly from multiplier 804. In some embodiments, adder 826 is arranged to receive code multiplied signal 814 directly from multiplier 806. In some embodiments, adder 826 is arranged to receive code multiplied signal 816 directly from multiplier 808.

Match filter 220 may be arranged output filtered signal 250 based on CDM signal 828. In some embodiments, match filter 220 is arranged to receive CDM signal 828 directly from adder 826. DAC 222 may be arranged to output analog signal 252 based on filtered signal 250. In some embodiments, DAC 222 is arranged to receive filtered signal 250 directly from match filter 220.

CRO 202, 204, 206 and 208 may operate in a similar manner as discussed above with reference to FIG. 2. Modulators 210, 212, 214 and 216, perform modulation and forward error correction coding for input coded signals 232, 234, 236 and 238, respectively and output corresponding corrected modulated signals 240, 242, 244 and 246 in a similar manner as discussed above with reference to FIG. 2.

Multipliers 802, 804, 806 and 808 may be configured as code multipliers, performing multiplication of input signals with specific codes and delivering corresponding code multiplied signals 810, 812, 814 and 816. For example, multiplier 802 will multiply modulated signal 240 with code 818 to generate code multiplied signal 810. Accordingly, a receiver (not shown) that is intended to receive modulated signal 240 will recognize the code 818 aspect of code multiplied signal 810. The receiver that is intended to receive modulated signal 240 will then be able to demodulate and process the information within code multiplied signal 810, while ignoring code multiplied signals 812, 814 and 816. Similarly, another receiver that is intended to receive modulated signal 242 will be able to demodulate and process the information within code multiplied signal 812, while ignoring code multiplied signals 810, 814 and 816. Further, yet another receiver that is intended to receive modulated signal 244 will be able to demodulate and process the information within code multiplied signal 814, while ignoring code multiplied signals 810, 812, and 816. Finally, still another receiver that is intended to receive modulated signal 246 will be able to demodulate and process the information within code multiplied signal 816, while ignoring code multiplied signals 810, 812 and 814.

Adder 826 may perform a summation of input code multiplied signals 810, 812, 814 and 816 and output a single stream of CDM signal 828.

Match filter 220 may perform filtering in order to maximize the signal-to-noise ratio of input CDM signal 828 and output filtered signal 250. Match filter 220 may operate in a similar manner as discussed above with reference to FIG. 2. DAC 222 may convert filtered signal 250 to analog signal 252 in a similar manner as discussed above with reference to FIG. 2.

In this non-limiting example, four CROs may accept four outroute streams as discussed with reference to FIG. 2. However, it should be noted that any number of CROs may be used to a corresponding number of outroute streams.

In accordance with a multiplexed arrangement of the present invention, a plurality of outroute streams may be modulated, each at a conventional rate. Then the plurality of modulated outroute streams may be added together, filtered and converted into analog signals at a much higher rate. Accordingly, the overall data throughput provided by a CDM transmitter in accordance with the present invention is much greater than that of a conventional CDM transmitter as a result of aggregating multiple conventional information streams into an aggregate information stream performing at a significantly higher rate of operation.

Again, in accordance with an aspect of the present invention, a single transmitter is operable to transmit a single data stream that includes a plurality of outroute codeblocks that have been multiplexed and added together. A single receiver will be able to receive the entire single data stream. For efficient processing, the receiver will only process a portion of the entire received single data stream. This aspect of the present invention will now be described with reference to FIG. 9.

Figure 9:
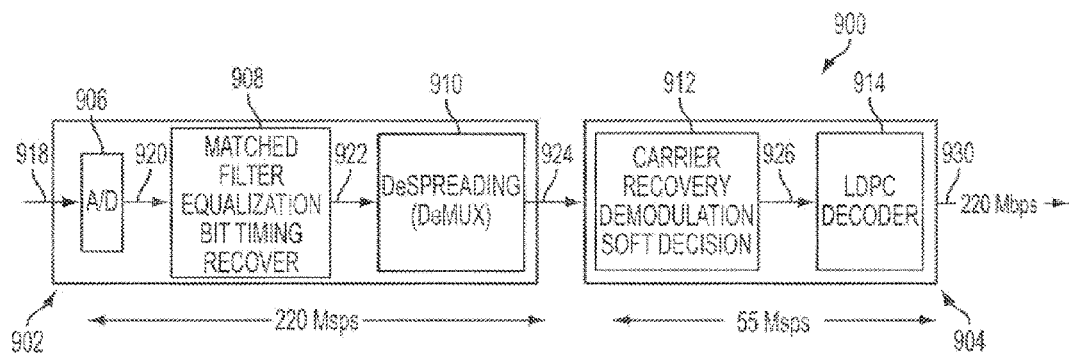
FIG. 9 illustrates an example CDM receiver, in accordance with an aspect of the present invention.

FIG. 9 illustrates an example CDM receiver, in accordance with an aspect of the present invention.

A CDM receiver 900 includes a faster operational portion 902 and a slower operational portion 904.

CDM receiver 900 may receive and process a CDM modulated signal and deliver a recovered signal. Non-limiting examples of processing includes ADC, matched filter equalization, bit timing recovery, de-spreading, carrier recovery, demodulation, soft decision, LDPC decoding and post processing. CDM receiver 900 may receive and process signals as described with reference to FIG. 7 and as transmitted by receiver 800 as described with reference to FIG. 8.

Faster operational portion 902 may receive and process a CDM modulated signal and deliver a de-spreaded signal. Slower operational portion 904 may receive a de-spreaded signal from faster operational portion 902 and deliver a recovered signal.

Faster operational portion 902 includes an ADC 906, a filter 908 and a de-multiplexer 910.

ADC 906 may receive an analog signal 918 and output a digitized signal 920. Filter 908 is arranged to output a filtered signal 922 based on digitized signal 920. In some embodiments, filter 908 is arranged to receive digitized signal 920 directly from ADC 906. De-multiplexer 910 is arranged to output a de-spreaded signal 924 based on filtered signal 922. In some embodiments, de-multiplexer 910 is arranged to receive filtered signal 922 directly from filter 908.

ADC 906 may perform conversion of a received analog signal 918 to digitized signal 920. ADC 906 may operate in a similar manner as ADC 502 discussed above with reference to FIG. 5.

Filter 908 may process digitized signal 920 received from ADC 906. Non-limiting examples of processing performed by filter 908 include matched filtering, equalization and bit timing recovery. Filter 908 may optimize the signal-to-noise ratio of a received signal.

De-multiplexer 910 may perform de-spreading of received filtered signal 922 and deliver de-spreaded signal 924.

Slower operational portion 904 includes a demodulator 912 and a LDPC decoder 914.

Demodulator 912 is arranged to output a signal 926 based de-spreaded signal 924. In some embodiments, demodulator 912 is arranged to receive de-spreaded signal 924 directly from de-multiplexer 910. LDPC decoder 914 is arranged to output a recovered signal 930 based on demodulated signal 926. In some embodiments, LDPC decoder 914 is arranged to receive demodulated signal 926 directly from demodulator 912.

Demodulator 912 may process de-spreaded signal 924 received from de-multiplexer 910 and deliver demodulated signal 926. Non-limiting examples of processing performed by demodulator 912 include carrier recovery, demodulation and soft decision.

LDPC decoder 914 may receive demodulated signal 926 from demodulator 912 and perform LDPC decoding. LDPC decoder 914 may operate in a similar manner to LDPC decoder 510 as discussed above with reference to FIG. 5.

CDM receiver 900 may receive analog signal 918 encoded and modulated as described with reference to example CDM codeblock 700 of FIG. 7. Analog signal 918 may be processed at a faster operational speed by faster operational portion 902. Faster operational portion 902 may deliver a digitized, filtered and de-spread signal denoted as de-spreaded signal 924. Slower operational portion 904 may receive de-spreaded signal 924 and perform demodulation and decoding of de-spreaded signal 924 for delivery of recovered information via recovered signal 930. Outroute 702 may illustrate an example of recovered information.

For purposes of discussion, presume that analog signal 918 corresponds to the combination of outroutes 702, 704, 706 and 708, which corresponds to analog signal 252 as provided by transmitter 800. Further, presume that CDM receiver 900 is configured to retrieve data within outroute stream signal 226, which in this example corresponds to outroute 704. In this example, the processing of analog signal 918 is performed at an increased rate by faster operational portion 902. Now, presume that de-spreaded signal 924 corresponds to modulated signal 242 and presume that modulated signal 242 corresponds to outroute 704. In such a case, slower operational portion 904 only be required to demodulate and decode the portions of analog signal 252 that corresponds to modulated signal 242. Therefore, slower operational portion 904 may operate at a reduced rate. Furthermore, operation at a reduced rate reduces cost, complexity, semiconductor real-estate and power consumption.

Figure 10:
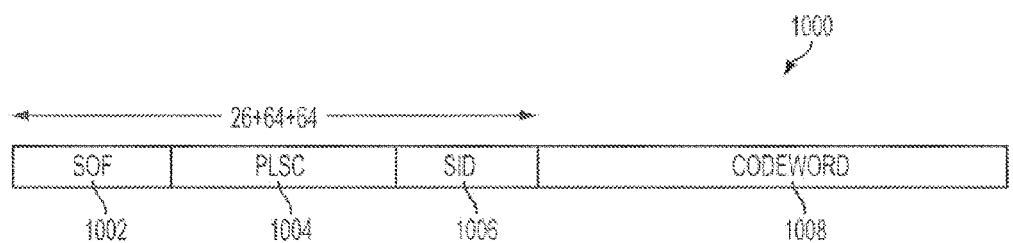
FIG. 10 illustrates an example codeblock frame, in accordance with an aspect of the present invention.

FIG. 10 illustrates an example codeblock frame 1000, in accordance with an aspect of the present invention.

A codeblock frame 1000 includes, a start of frame (SOF) 1002, a physical layer signaling code (PLSC) 1004, a stream identifier (SID) 1006 and a codeword 1008. SOF 1002 may be arranged at the beginning of the example codeblock frame 1000. PLSC 1004 may be arranged to follow SOF 1002 in the frame structure of example codeblock frame 1000. SID 1006 may be to follow PLSC 1004 and prior to codeword 1008 in example codeblock frame 1000. Codeword 1008 may be arranged at the end of example codeblock frame 1000.

SOF 1002 may be configured as a 26 bit sub-frame for identifying a start of the frame. PLSC 1004 may be configured as a 64 bit sub-frame for performance of physical layer signal coding. The coding may be a portion of example codeblock frame 1000 and may be transmitted or received during communication between a transmitter and a receiver. SID 1006 may be configured as a 64 bit Stream identifier for identifying a stream at a receiving station. SID 1006 may be intended to be received by a station that receives frames corresponding to a SID match. SID 1006 may also inform the receiver what the modulation scheme of the codeblock. Codeword 1008 contains the original information, wherein the information are coded bits.

In operation, outroute signals, described with reference to FIG. 2, may be formed into a frame structure with building blocks SOF 1002, PLSC 1004, SID 1006 and codeword. A codeblock may be configured as a first level framing structure containing synchronization and signaling information as described with reference to FIG. 4 and FIG. 7.

In accordance with an aspect of the present invention, an example stream format for a generic continuous stream will now be described in greater detail with reference to FIG. 11. Generic Stream Encapsulation (GSE) protocol may enable efficient encapsulation of internet protocol (IP) and other network layer packets over a generic physical layer. Encapsulated data may be transported over GSE packet streams. GSE encapsulation relies on the physical layer being able to perform error detection.

Figure 11:
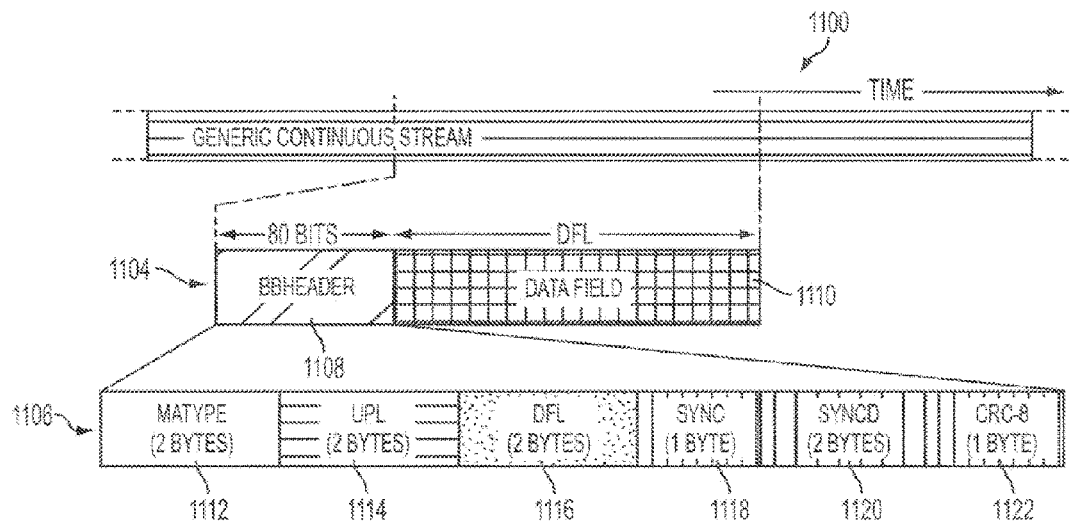
FIG. 11 illustrates an example stream in accordance with an aspect of the present invention.

FIG. 11 illustrates an example stream in accordance with an aspect of the present invention.

A stream 1100 includes a multiplicity of main frames with a sampling denoted as a frame 1104.

Stream 1100 may be used for communication between a transmitter and a receiver (e.g. transmitter 200 of FIG. 2, receiver 500 of FIG. 5, receiver 600 of FIG. 6, transmitter 800 of FIG. 8 and CDM receiver 900 of FIG. 9.

Frame 1104 includes a sub frame base band header (BBHEADER) 1108 and a data field (DATAFIELD) 1110. BBHEADER 1108 includes a subframe 1106 that may be subdivided further into smaller frames, a transport stream input (MATYPE) 1112, a user packet length (UPL) 1114, a data field length (DFL) 1116, a synchronization bit (SYNC) 1118, a distance from the beginning of a datafield (SYNCD) 1120 and a cyclic redundancy check bit (CRC-8) 1122.

BBHEADER 1108 and DATAFIELD 1110 may be arranged within stream 1100. MATYPE 1112, UPL 1114, DFL 1116, SYNC 1118, SYNCD 1120 and CRC-8 may be arranged within BBHEADER 1108.

Stream 1100 may be configured as an outroute stream with a multiplicity of codeblocks multiplexed into a single stream using either TDM or CDM multiplexing methods. Frame 1104 may be configured as a packet format within stream 1100 delivering BBHEADER 1108 and DATAFIELD 1110. MATYPE 1112 may be configured as a portion of subframe 1106, a 2-byte packet operating as a transport stream input. UPL 1114 may be configured as a portion of subframe 1106, a 2-byte packet functioning as a user packet length for stream 1100.

DFL 1116 may be arranged within BBHEADER 1108. DFL 1116 may provide user data field length and prevent the packet from becoming fragmented during the transport process. SYNC 1118 may be arranged within BBHEADER 1108. SYNC 1118 may provide a synchronization bit to BBHEADER 1108 for providing frame synchronization. SYNCD 1120 may be arranged within BBHEADER 1108. SYNCD may provide a value indicating distance in bits from the beginning of DATAFIELD 1110 to the end DATAFIELD 1110. CRC-8 1122 may be arranged within BBHEADER 1108. CRC-8 1122 may provide an error detection code applied to the first 9 bytes of BBHEADER 1108.

In operation, stream 1100 includes a multiplicity of frame 1104 with a variable length. Encapsulated IP packet data may be transported using GSE streams. Each GSE packet may be composed of GSE header followed by GSE payload reference as DATAFIELD 1110. BBHEADER 1108 may be composed of MAYTYPE, UPL, DFL, SYNC SYNCD and CRC-8 as described with reference to FIG. 11.

Variable lengths for frame 1104 may prevent information from being transported via packets and, as a result, some of the unused bits in BBHEADER 1108 may be used for de-multiplexing codeblocks.

In accordance with an aspect of the present invention, a receiver may determine which codeblocks should be demodulated and decoded from the entire received stream of codeblocks based on a timeplan. The timeplan indicates the positions of codeblocks within the stream of codeblocks. This will be described in greater detail with reference to FIG. 12.

Figure 12:
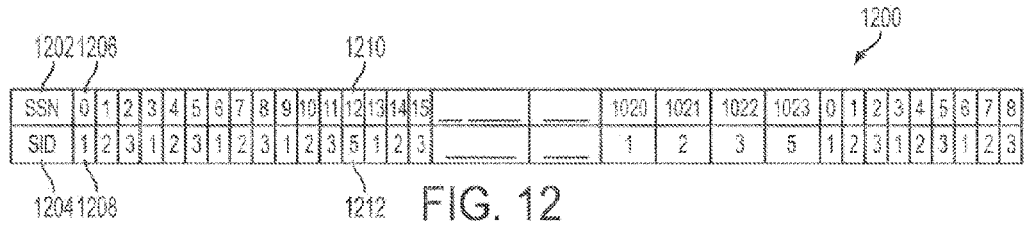
FIG. 12 illustrates an example timeplan in accordance with an aspect of the present invention.

FIG. 12 illustrates an example timeplan in accordance with an aspect of the present invention.

A timeplan 1200 includes a stream sequence number (SSN) 1202 and a stream identifier SID 1204.

An element of SSN 1202 may be arranged with a corresponding SID 1204 within timeplan 1200.

Timeplan 1200 may be communicated via a codeblock, for example outroute codeblock 402 (FIG. 4). The codeblock location for transmission of timeplan 1200 may repeatedly be transmitted via the same codeblock, for example outroute codeblock 402 (FIG. 4).

In an example embodiment, SSN 1202 may be configured as a 10-bit counter from 0 to 1023 within timeplan 1200 for assigning sequence number to codeblocks. SID 1204 may be configured for indicating a portion of a stream for reception by a receiving terminal and a portion of a stream for reception by the universe of receiving terminals.

An outroute is a combination of sub-streams. Accordingly, a timeplan is transmitted for every outroute. In this example, timeplan 1200 may be transmitted for every outroute, with potentially different outroutes being transmitted in a single channel. Furthermore, in an example embodiment, timeplan 1200 may be transmitted once every 1024 codeblocks.

In operation, timeplan 1200 may be configured as a sequence of SSN 1202 with a corresponding SID 1204 and may be broadcast to all receivers within a system. For purposes of discussion, presume that transmitter 200 of FIG. 2 transmits analog signal 252 to four different receivers, wherein the four different receivers are constructed so as to demodulate and process one of outroute stream signal 224, outroute stream signal 226, outroute stream signal 228 and outroute stream signal 230 respectively. In such a case, each of the four receivers will receive the entire analog signal 252, which includes timeplan 1200.

Furthermore, a receiver attempting to acquire information via an outroute carrier would receive timeplan 1200 within a predetermined period of time. A receiver may receive and decode timeplan 1200 to determine which portions of a codeblock are associated with the receiver. At that point, the receiver would then decode the stream that carries the SID and SSN information. Reception and decoding of timeplan 1200 by a receiver may occur periodically as necessary. Following reception of an initial timeplan 1200, a determination of operating on a different outroute may be realized, after which a receiver may switch to the correct outroute. Following a switch to a new outroute, a receiver may receive and decode a new timeplan 1200 corresponding to the new outroute.

For example, a sequence number 1206 may have a value of "0," indicating the first transmission for SSN 1202 and SID 1204. Furthermore, an identifier 1208 may have a value of "1," indicating the first portion of a codeblock may be received by receiver "1." Similarly, a sequence number 1210 may have a value of "12" indicating the twelfth transmission for SSN 1202 and SID 1204. Further, an identifier 1212 may have a value of "S" indicating that the twelfth portion of a codeblock may be received by the universe of receivers.

Figure 13:
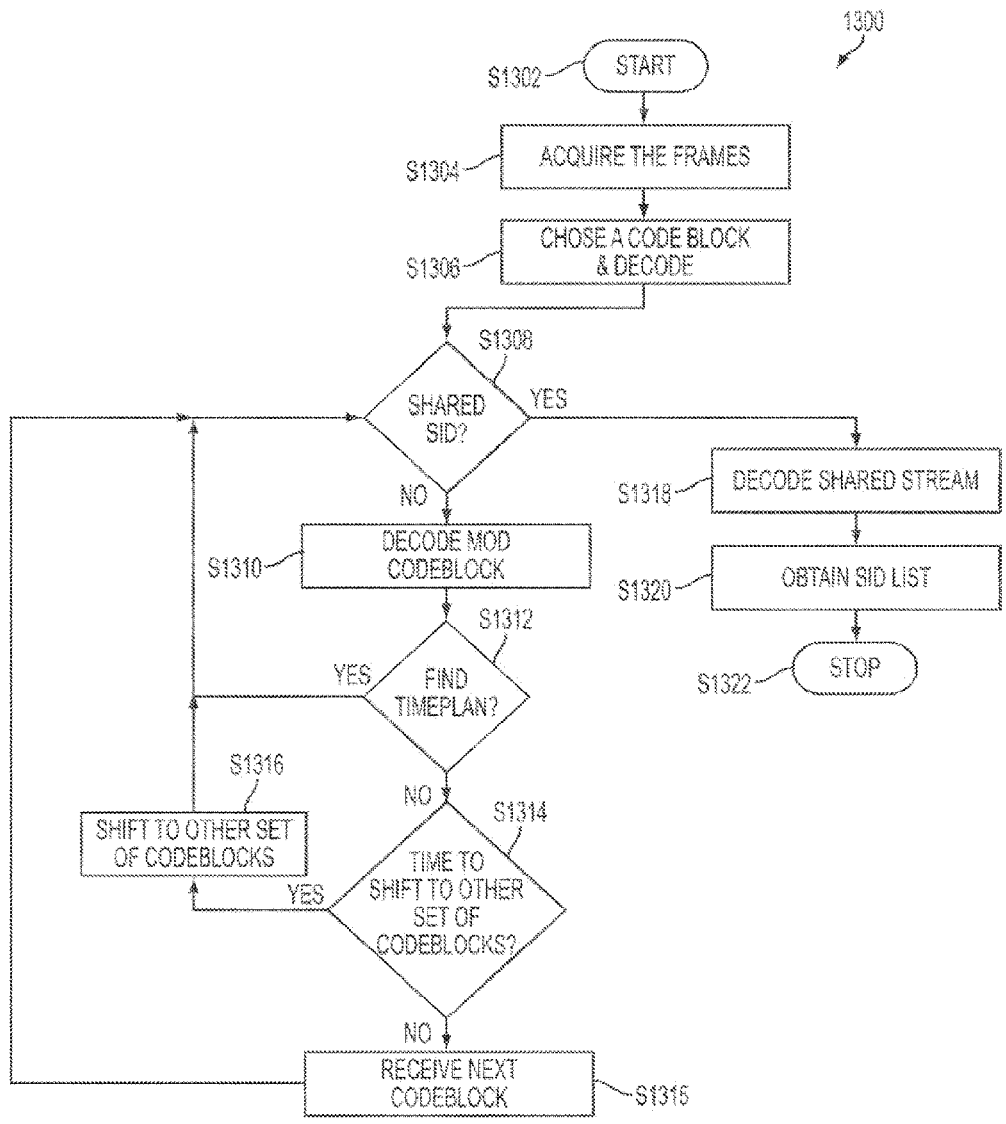
FIG. 13 illustrates an example method of timeplan acquisition in accordance with an aspect of the present invention.

FIG. 13 illustrates an example method for timeplan acquisition, in accordance with an aspect of the present invention.

A method 1300 starts (S1302) and the frames may be acquired (S1304).

Receiver 500 of FIG. 5, receiver 600 of FIG. 6 or CDM receiver 900 of FIG. 9 may begin receiving a stream of information as denoted by stream 1100 of FIG. 11. For purposes of simplifying the discussion, presume that receiver 500 is used. Furthermore, receiver 500 may perform frame synchronization for determining the start of frame 1104. Still further, receiver 500 may receive and process received frames (e.g. frame 1104).

Receiver 500 may then select a codeblock for processing (S1306). For purposes of discussion, presume that receiver 500 selects the first codeblock for processing. The selection of codeblock to process may be performed via de-multiplexer 506.

It may then be determined whether the selected codeblock has a shared SID "S" (S1308). For example, SID 1006 of FIG. 10 may be decoded by post processor 528. Decoded SID 1006 may indicate whether the received information may be communicated to a particular receiver as illustrated by identifier 1208 of FIG. 12 or the universe of terminals as illustrated by identifier 1212.

If it is determined that the selected codeblock does not have a shared SID (S1308), then the receiver may receive and decode a codeblock from a different portion of frame 1104 of FIG. 11 (S1310). For example, receiver 500 may then select another codeblock for processing.

At this point it may be determined whether the newly selected codeblock includes a timeplan (S1312). If so, then it is again determined whether the newly selected codeblock has a shared SID (S1308).

If the selected codeblock does not include a timeplan (S1312), then a determination for shifting to an alternate set of codeblocks may be determined (S1314). For example, once receiver 500 has received and decoded a timeplan, receiver 500 may determine the proper codeblocks to receive and process.

If it is determined that it is not time to shift to an alternate set of codeblocks, then another codeblock may be received (S1315) followed by a determination of shared SID (S1308). In an example embodiment, a first set of codeblocks may have even SSN, whereas the other set may have odd SSN. If the shared SID is not found in the first set of codeblocks, it will be found in the next set of codeblocks.

If it is determined that it is time to switch to an alternate set of codeblocks (S1314), then the sequence of codeblocks may be switched to the alternate set and a codeblock from the alternate set may be received (S1316) followed by a determination of shared SID (S1308).

Once it is determined that there is a shared SID (S1308), the shared stream may be decoded (S1318). At that point, the SID list may be generated (S1320). A shared SID contains information to be shared by all substreams. One type of shared information that may be in a shared SID is the timeplan. In an example embodiment, a timeplan is transmitted once in a superframe having 1024 codeblocks, many of which may be shared SIDs. As such, when the SID list is generated, the shared SIDs are searched for the timeplan. Receiver 500 may determine portions of the codeblock associated with receiver 500 as described with reference to FIG. 2. For example, presume for the sake of discussion that receiver 500 corresponds to SID 1 within timeplan 1200 of FIG. 12. Accordingly, receiver 500 would then decode SSNs having an SID 1 associated therewith. Returning to FIG. 5, post processor 528 would then instruct de-multiplexer 506, via data signal 526, to only pass the codeblocks corresponding to the SSNs associated with the SID 1 of time plan 1200.

Once a receiver has determined portions associated with receiver, execution of method 1300 may terminate (S1322).

Figure 14:
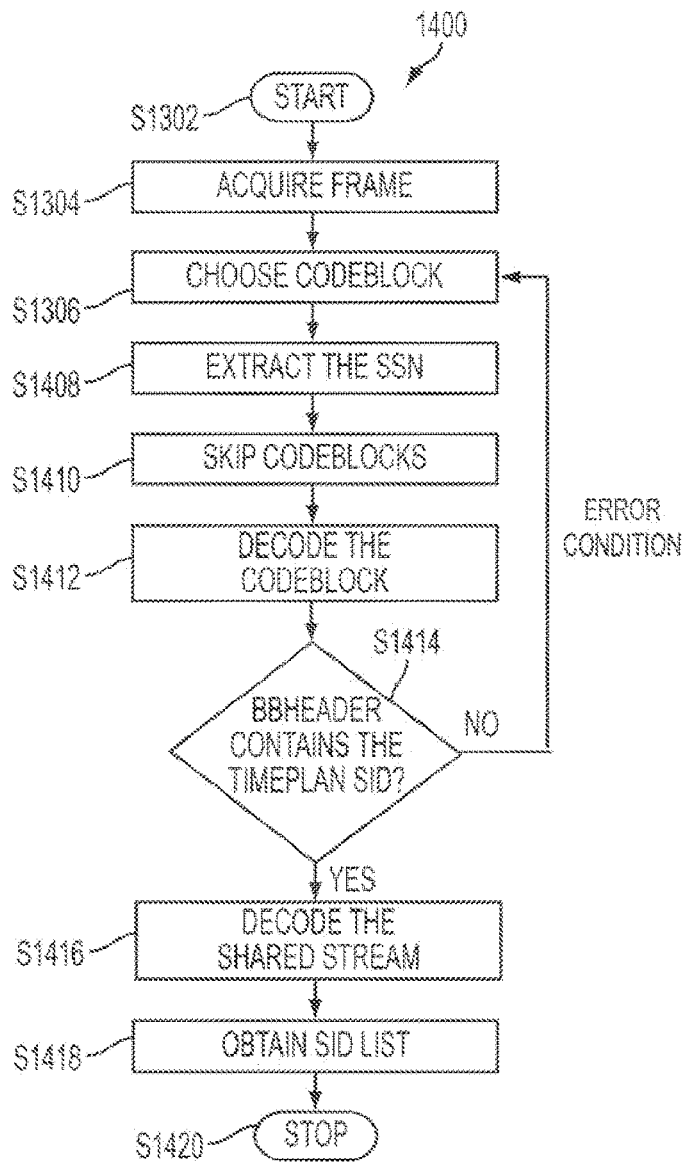
FIG. 14 illustrates another example method of timeplan acquisition in accordance with an aspect of the present invention.

FIG. 14 illustrates an example method 1400 of timeplan acquisition in accordance with an aspect of the present invention. This method presents a simplified method for timeplan acquisition requiring less processing for timeplan acquisition as compared to method 1300.

The beginning of method 1400 is similar to method 1300 discussed above with reference to FIG. 13. In particular method 1400 starts (S1302), frames are acquired (S1304) and a codeblock is selected (S1306).

At this point method 1400 differs from method 1300. Here, SSN may be extracted from the selected codeblock (S1408). The SSN, for example as described with reference to FIG. 12, may be extracted for processing.

Based upon on SSN received, the receiver may skip codeblocks (S1410). For example, the receiver may determine the number of codeblocks to skip to access the desired codeblock based upon the received SSN. At this point the SID list would be obtained.

It is then determined whether the accessed codeblock has a shared SID (S1414). For example, for purposes of discussion, presume that SID 1006 of FIG. 10 is decoded. Decoded SID 1006 may indicate whether the received information may be communicated to a particular receiver (for example as illustrated by identifier 1208 of FIG. 12) or to all the receivers (for example as illustrated by identifier 1212).

If it is determined that the accessed codeblock does not have a shared SID, then a new codeblock is chosen (S1306). Alternatively, if it is determined that the accessed codeblock does have a shared SID, then the shared stream may be decoded (S1416). Once a receiver has received a timeplan and found a correct channel, shared information stream may be received and decoded.

At that point the SID list is obtained from the timeplan (S1418). For example, the receiver may determine portions of codeblock associated with itself, as described with reference to FIG. 2.

Once a receiver has determined portions associated with receiver, method 1400 stops (S1420).

Figure 15:
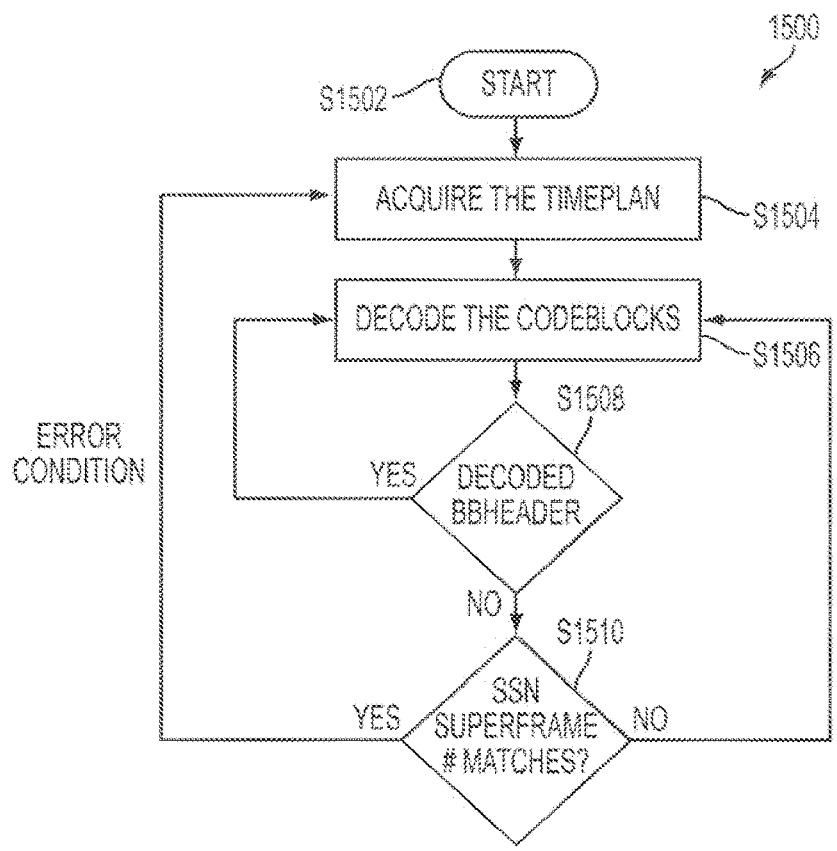
FIG. 15 illustrates another example method of timeplan acquisition in accordance with an aspect of the present invention.

FIG. 15 illustrates an example method of timeplan acquisition following powering up of a receiver, in accordance with an aspect of the present invention.

A method 1500 starts (S1502) and timeplan 1200 of FIG. 12 may be acquired.

Following powering up of a receiver, timeplan 1200 may be acquired in a similar manner as discussed above with referenced to FIG. 13 or FIG. 14.

Receive codeblocks may be decoded (S1506).

A receiver may receive and decode codeblocks as discussed previously with reference to FIGS. 3-11.

A determination as to whether received codeblocks correspond to correct codeblocks associated with timeplan 1200 may be performed (S1508).

For a determination of not receiving codeblocks associated with timeplan 1200 (S1508), a receiver may skip codeblocks until receiving a codeblock associated with timeplan 1200 (S1510).

A receiver may ignore or disregard information received not associated with timeplan 1200.

Following power-up, a received timeplan 1200 may not correspond with received information and a receiver may skip received information until received information corresponds with timeplan 1200. For example, a timeplan may be modified synchronous with a receiver powering up and the received timeplan may be associated with information to be received at a later point in time.

Figure 16:
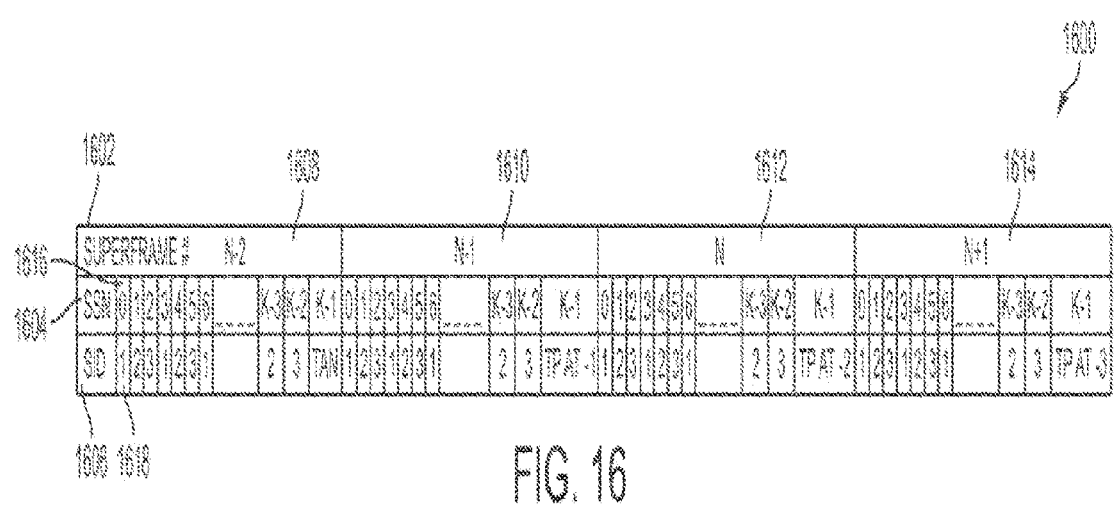
FIG. 16 illustrates an arrangement of a plurality of superframes, in accordance with an aspect of the present invention.

FIG. 16 illustrates an arrangement 1600 of a plurality of superframes, in accordance with an aspect of the present invention.

Arrangement 1600 of a plurality of superframes includes a row 1602 of superframes, a row 1604 of SSNs and a row 1606 of SIDs. Row 1602 includes N−2 superframe 1608, N−1 superframe 1610, N superframe 1612, and N+1 superframe 1614. Row 1604 lists the SSNs within each superframe, whereas row 1606 lists the SIDs within each superframe.

Superframe 1608 includes a plurality of frames with a sampling sequence number 0 (SSN 0) denoted as 1616 presented with an SID having a value "1," as indicated by 1618.

Sequence number 1616 may perform the same function as SSN 1202 discussed above with reference to FIG. 12. SID 1618 may perform the same function as SID 1204 discussed above with reference to FIG. 12.

Due to de-multiplexing of codeblocks as described with reference to FIGS. 3-9, updating a timeplan for a receiver may require several codeblocks to perform. As a result of requiring several codeblocks for updating a timeplan, synchronization of timeplans with received information may be performed by transmitting updated timeplan information prior to implementation of the updated timeplan.

Furthermore, timeplan 1200 (FIG. 12) may be communicated via a codeblock, for example outroute codeblock 402 (FIG. 4). The codeblock location for transmission of timeplan 1200 with respect to a superframe, for example superframe 1608, may repeatedly be transmitted via the same codeblock, for example outroute codeblock 402 (FIG. 4).

For example, a system seeking to update a receiver timeplan during frame x may begin transmitting updated time plan information during the transmission of frame x-2, or two frames prior to implementation of the new timeplan. Prior to frame x, a receiver may continue to operate based upon the timeplan transmitted prior to frame x-2. Furthermore, once a timeplan has been transmitted to a receiver, the receiver may operate based on the updated timeplan (e.g. frame x).

In accordance with aspects of the present invention, a plurality of outroute data streams may be multiplexed at the transmitter side, thereby achieving multiple times greater data capacity than existing transmitters. Similarly, a received multiplexed data stream may be de-multiplexed at the receiver side in order to achieve greater data capacity.

The de-multiplexer 620 used by the receiver 600 to reduce the amount of data processed by the receiver 600 may be a code block selector (CBS). The CBS may allow the receiver 600 to control the rate of the data presented to the processing elements down stream, such as the LDPC Decoder 622, and to synchronize an internally stored timeplan, such as the timeplan 1200, with the incoming data traffic from a transmitter, such as the transmitter 200.

Figure 17:
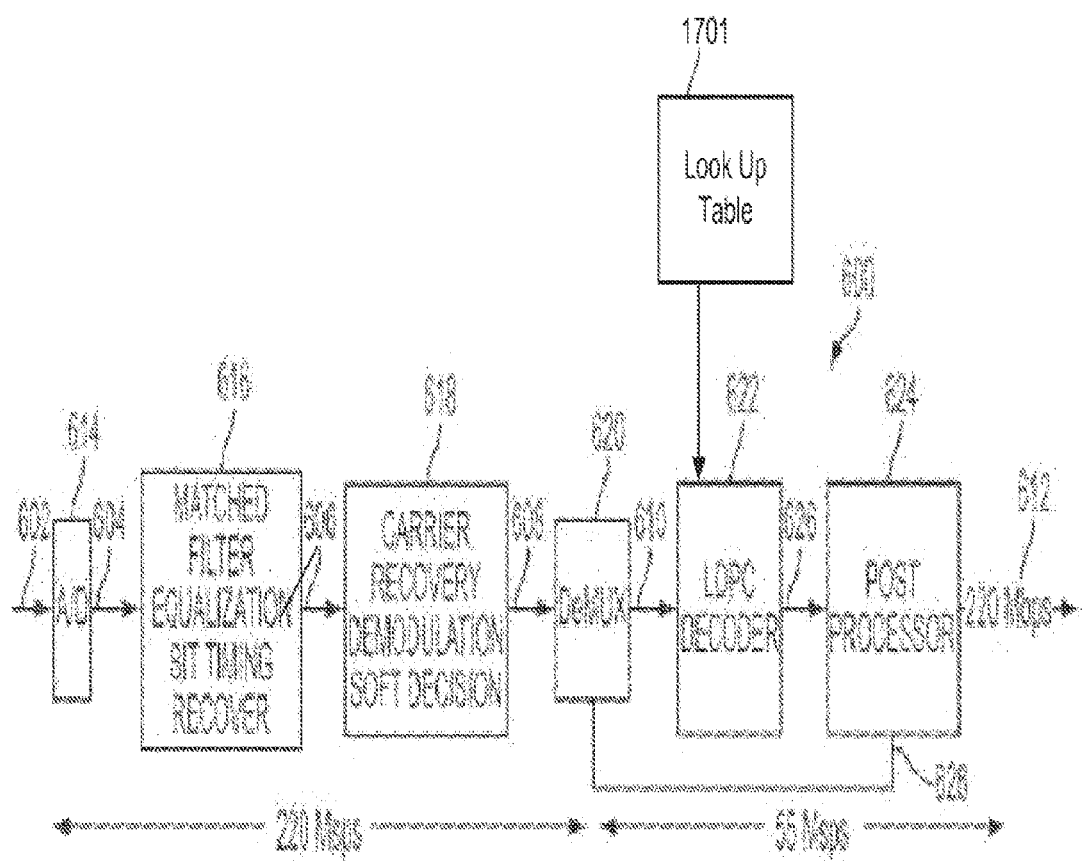
FIG. 17 illustrates an example receiver with a code block selector.

FIG. 17 illustrates an example receiver with a code block selector. The CBS may be the de-multiplexer 620, and may be a hardware block connected to the output of the demodulator 618. For example, the CBS may be the first functional hardware block in a Forward Error Correction (FEC) unit of the Forward Channel Subsystem of an ASIC in the receiver 600. The CBS may receive demodulated superframes from the demodulator 618, and may select a subset of codeblocks, such as the codeblocks 402 and 410, to be further processed by the receiver 600. The CBS may use a Look Up Table (LUT) 1701 to determine which demodulated codeblocks to pass on for further processing. The LUT 1701 may be a table containing 1024 entries, which may correspond to the number of codeblocks in a superframe, such as the superframe 1608. Each entry in the LUT 1701 may contain one bit. If an entry contains a value of "0", this may indicate that the corresponding codeblock should be blocked by the CBS. If the entry contains a value of "1", this may indicate that the corresponding codeblock should be passed on for further processing in the receiver 600. Entries in the LUT 1701 may be based on, for example, the timeplan 1200 received by the receiver 600.

Figure 18A:
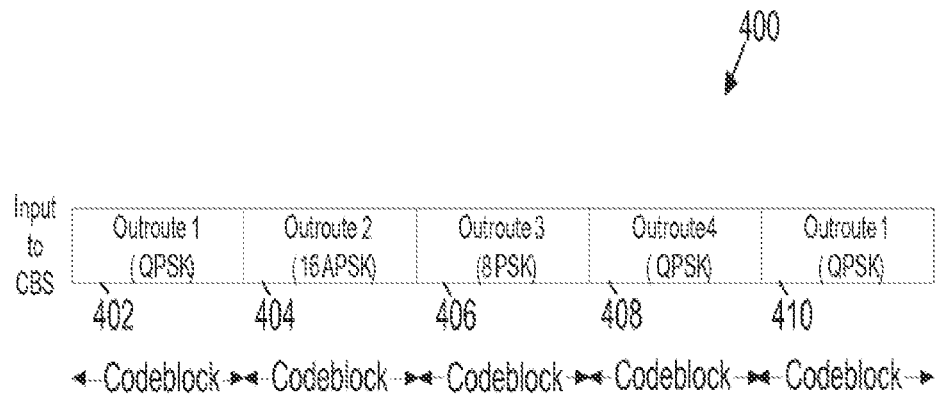
FIGS. 18a and 18b illustrate an example of codeblock input and output for a code block selector.
Figure 18B:
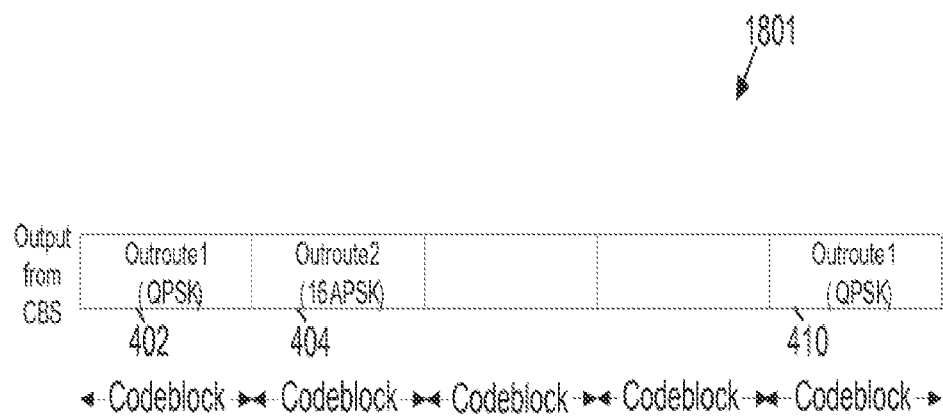

FIGS. 18a and 18b illustrate an example of codeblock input and output for a code block selector. The TDM codeblock data stream 400 received by the receiver 600 may include the codeblocks 402, 404, 406, 408, and 410, which may be output from the demodulator 618b to the de-multiplexer 620, which may be the CBS. The CBS may check the LUT 1701 for each of the codeblocks 402, 404, 406, 408, and 410, and may receive a response of "11001." This may indicate that the CBS should block the codeblocks 406 and 408, corresponding to the outroute 3 228 and the outroute 4 230, while passing the codeblocks 402, 404, and 410, corresponding to the outroute 1 224 and the outroute 2 226, on for further processing in the receiver 600. The CBS may output the de-multiplexed data stream 1801, which may include the codeblocks 402, 404, and 410. This may result in the downstream processing elements of the receiver 600 not having to process the code blocks 406 and 408, reducing the amount of processing power needed to handle the incoming data stream without requiring a reduction in the amount of data being sent by a transmitter, such as the transmitter 200.

FIG. 19 illustrates an exemplary look up table that passes every codeblock for processing. FIG. 20 illustrates exemplary input and output of a code block selector that references a look up table that passes every code block for processing. The LUT 1701 may have all entries set to "1". This may indicate that all codeblocks in a data stream processed by the CBS are to be passed on for further processing. As depicted in FIG. 20, when using the LUT 1701 where all entries are "1", when the CBS references the LUT 1701 to determine whether to pass on a codeblock from the TDM codeblock data stream 400, the LUT 1701 may return a LUT entry 2001 of "1." This may cause the CBS to output all of the codeblocks from the TDM codeblock data stream 400 as de-multiplexed data stream 1801. None of the codeblocks from the TDM codeblock data stream 400 may be dropped.

Figures 21, 22:
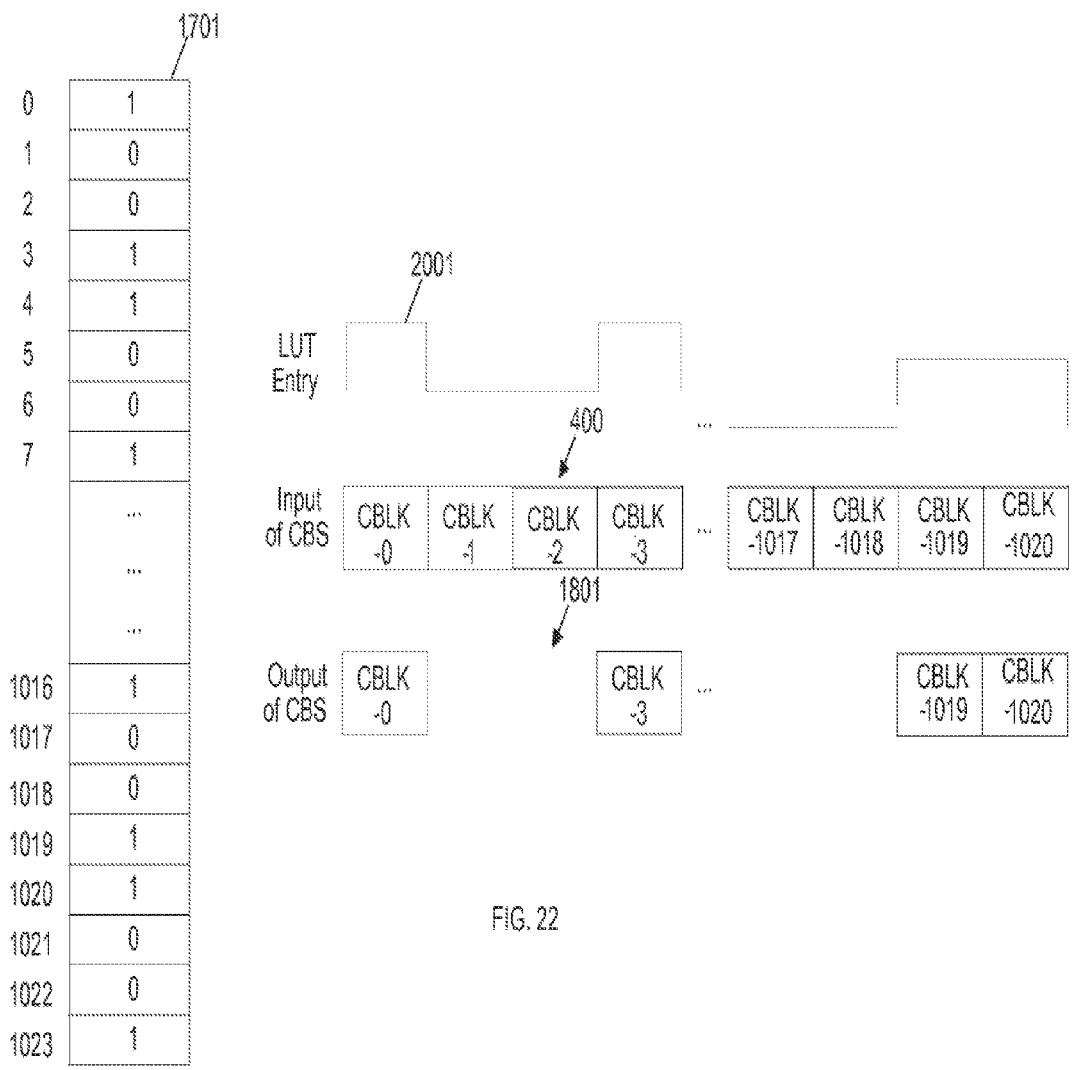
FIG. 21 illustrates an exemplary look up table that passes 2 out of every 4 codeblocks for processing.
FIG. 22 illustrates exemplary input and output of a code block selector that references a look up table that passes 2 out of every 4 codeblocks for processing.

FIG. 21 illustrates an exemplary look up table that passes 2 out of every 4 codeblocks for processing. FIG. 22 illustrates exemplary input and output of a code block selector that references a look up table that passes 2 out of every 4 codeblocks for processing. The LUT 1701 may have a first entry set to "1", and then alternate between two "0" entries and two "1" entries. This may indicate 2 out of every 4 codeblocks in a data stream processed by the CBS are to be passed on for further processing. As depicted in FIG. 22, when using the LUT 1701 where 2 out of every 4 codeblocks are to be passed on, when the CBS references the LUT 1701 to determine whether to pass on a codeblock from the TDM codeblock data stream 400, the LUT 1701 may initially return the LUT entry 2001 as "1," followed by two "0" entries, followed by two "1" entries. This may cause the CBS to output 2 out of every 4 codeblocks from the TDM codeblock data stream 400 as de-multiplexed data stream 1801. The first codeblock, CBLK-0, may be passed on based on the LUT entry 2001 of "1" as the initial entry, in position 0, of the LUT 1701. The next two codeblocks, CBLK-1 and CBLK-2, may be dropped, based on the LUT entry 2001 of "0" in the next two positions in the LUT 1701. This may be repeated for all 1024 entries in the LUT 1701, starting over at the beginning of the 1701 once all of the codeblocks in the current superframe of the TDM codeblock data stream 400 have been processed by the CBS.

The entries in the LUT 1701 may pass on or drop the codeblocks in a superframe at any ratio. For example, as in FIG. 19, the LUT 1701 may have a "1" for every entry, and pass on all codeblocks, or, as in FIG. 21, may pass on half of the codeblocks. The LUT 1701 may pass on ⅔ of the codeblocks, or, if necessary, drop most or all of codeblocks.

Figure 23:
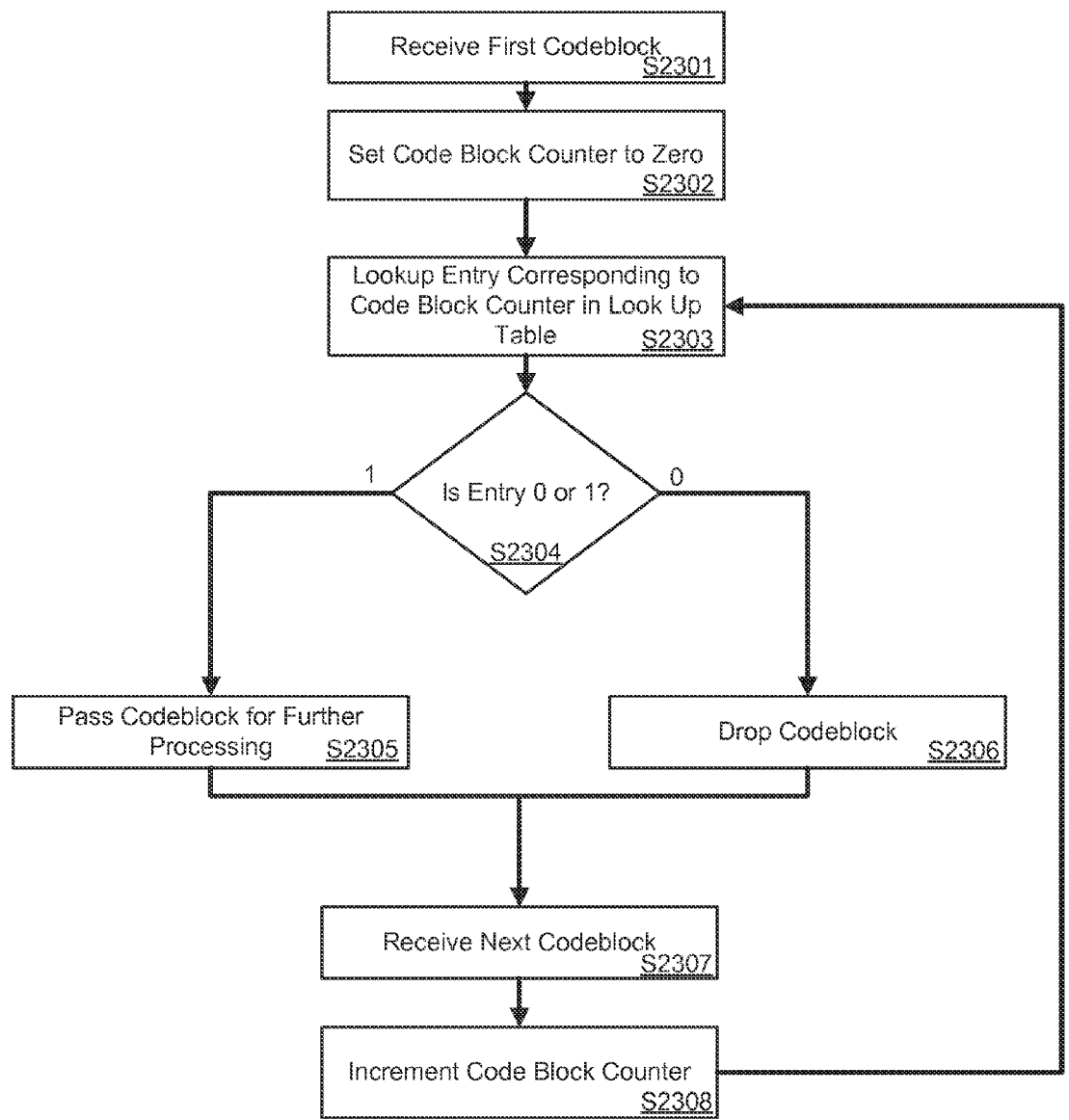
FIG. 23 illustrates an example method of operating a code block selector with a look up table.

FIG. 23 illustrates an example method of operating a code block selector with a look up table. The CBS may receive a first codeblock (S2301). For example, the receiver 600 may receive a superframe, which may be sent to the demodulator 618. The demodulator may demodulate the superframe and send a first codeblock from the superframe to the de-multiplexer 620, which may be the CBS.

Upon receiving the first codeblock, the CBS may set a Code Block Counter (CBS) to zero (S2302). The CBC may be a 10-bit number, from 0 to 1023, and may be used to address the LUT 1701. The CBS may lookup the entry corresponding to the CBS in the LUT 1701 (S2303). The first codeblock received by the CBS may cause the CBC to be set to 0, which may result in the CBS checking the first entry in the LUT 1701. For subsequent codeblocks, the current value of the CBC may be used. For example, when the $10^{th}$ codeblock is received by the CBS, the CBC may be 9, so the CBS may check the $9^{th}$ entry in the LUT 1701.

The CBS may determine if the looked up entry is a "1" or a "0" (S2304). If the entry in the LUT 1701 corresponding to the current CBC value is a "1", this may indicate the codeblock is to be passed on for further processing (S2305). Otherwise, if the entry is a "0", this may indicate the codeblock should be dropped by the CBS (S2306). For example, if the CBC is 5, and the entry in position 5 of the LUT 1701 is "1", the codeblock may be passed on from the CBS to the LPDC Decoder 622. If the entry is position 5 were "0", the codeblock may be dropped by the CBS, and not processed any further.

Once the current codeblock has been processed by the CBS and dropped or passed on, the CBS may receive the next codeblock (S2307). The next codeblock in the superframe may be sent to the CBS from the demodulator 618. Upon receiving the next codeblock, the CBS may increment the CBC (S2308). The incrementing of the CBC may ensure that the proper entry in the LUT 1701 is checked for the just received codeblock (S2302). For example, if CBS has just processed the first codeblock, with the CBS set to 0, and then received a second codeblock, the CBC may be incremented to 1. The incremented CBC may be used to check the LUT 1701 to determine what to do with the second codeblock. This may be repeated until the receiver 600 stops receiving a data stream.

Because the CBC may be a 10-bit number, the CBC may have a range of 0 to 1023, for 1024 distinct values, corresponding to the number of codeblocks in a superframe. The value of the CBS may correspond to the SSN 1202 of the codeblock being processed. When the last codeblock in a superframe is reached, the CBC may be at 1023, corresponding the SSN 1202 of 1023 of the last codeblock in the superframe. Incrementing the CBC at 1023 may result in the CBC being reset to 0, corresponding to the SSN 1202 of 0 of the first codeblock of the next superframe.

Figure 24:
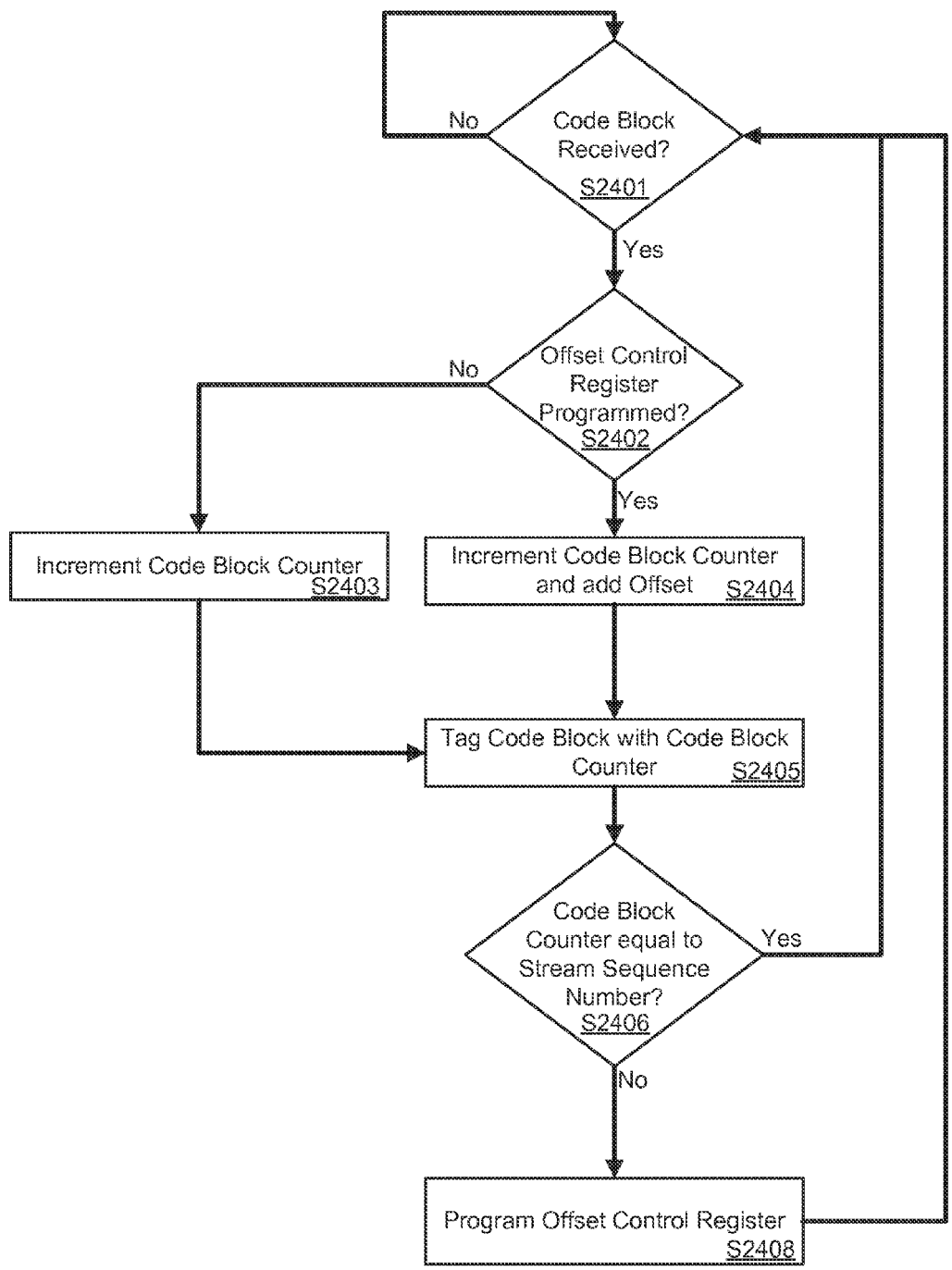
FIG. 24 illustrates an example method of synchronizing the code block counter.

The CBS may not have access to the SSN 1202 in the BBHEADER 1108 of the codeblocks received from the demodulator 618. When the CBS begins receiving codeblocks from the demodulator 618, there may be a discrepancy between the CBC and the SSN 1202 for the incoming codeblocks. The CBS may need to be synchronized with the SSN 1202. Downstream from the CBS, for example, at the post processor 624, the SSN 1202 may be decoded for a received codeblock, and compared to CBC value received for the codeblock. The difference between the two values may be the offset, and may be written to an offset control register in the CBS. FIG. 24 illustrates an example method of synchronizing the code block counter. The CBS may determine if a code block has been received (S2401). If a code block has not been received, the CBS may wait until a code block has been received (S2401). If a code block has been received, the CBS may check to see if an offset value has been written the offset control register (S2402). If no value has been written to the offset control register, the CBS may increment the CBC value (S2403). If a value has been written to the offset control register, the CBS may increment the CBC value, and then add the offset value to the resulting CBC value (S2404). For example, if the CBC value is 5, and the offset control register value is 3, the CBC may increment the CBC value to 6 and then add 3 for a CBC value of 9. After calculating the new CBC value, the CBS may tag the codeblock with the CBC value (S2405). At the post processor 624, the CBC value of the codeblock may be compared with the SSN 1202 value for the codeblock (S2406). If the values are equal, the offset control register may be left unchanged. If the values are not equal, the difference between the values may be written to the offset control register, as the CBS may need to be synchronizes with the SSN's of the incoming codeblocks, locking the CBS to the incoming code block sequence.

The CBS may have access to more than one LUT 1701. For example, there may be two LUT's 1701, a Ping LUT and a Pong LUT, each of which may have entries based on a different timeplan. The CBS may be instructed to switch between the two LUT's by, for example, software on the receiver 600, at any point in time, or at the end of a superframe. This may allow the receiver 600 and the CBS to operate with, and switch between, two or more separate timeplans.

The foregoing description of various preferred embodiments of the invention have been presented for purposes of illustration and description. It is not intended to be exhaustive or to limit the invention to the precise forms disclosed, and obviously many modifications and variations are possible in light of the above teaching. The example embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. An apparatus for a data rate controller comprising:
    a look up table comprising a plurality of entries; and
    a code block selector comprising a code block counter and configured to:
        receive a code block,
        increment a value of the code block counter,
        reference the code block with the value of the code block counter,
        look up an entry in the look up table corresponding to the value of the code block counter, and
        output the code block for further processing or drop the code block based on the entry in the look up table,
    wherein the look up table includes a same number of entries as a number of code blocks to be received in at least one of a superframe, a sequence of code blocks, and a data stream.

2. The apparatus of claim 1, further comprising:
    a post processor configure to receive the code block if the code block was not dropped by the code block selector, decode a stream sequence identifier from the code block, determine an offset by comparing the stream sequence identifier to the value of the code block counter referenced to the code block, and write the offset to register of the code block selector.

3. The apparatus of claim 1, further comprising:
a second lookup table comprising a plurality of entries wherein the code block selector is further configured to switch between the lookup table and the second lookup table.

4. The apparatus of claim 2, wherein the code block selector is further configured to add the offset to the value of the code block counter after dropping or outputting the code block.

5. A method for controlling a data rate comprising:
receiving a number of code blocks within at least one of a superframe, a sequence of code blocks, or a data stream; and
for each code block:
incrementing a value of a code block counter,
referencing the code block with the value of the code block counter,
looking up an entry in a look up table based on the value of the code block counter, and
outputting the code block or dropping the code block based on the entry in the lookup table,
wherein the look up table includes a same number of entries as the number of code blocks received in the at least one of the superframe, the sequence of code blocks, and the data stream.

6. The method of claim 5, further comprising, after outputting the code block:
decoding a stream sequence identifier for the code block;
comparing the value of the code block counter for the code block to the stream sequence identifier to generate an offset; and
writing the offset to a register.

7. The method of claim 5, further comprising:
receiving an instruction to switch from the look up table to a second look up table; and
looking up an entry in the second look up table.

8. The method of claim 6, further comprising, after outputting or dropping the code block:
adding an offset to the value of the code block counter.

9. The method of claim 5, further comprising setting the value of the code block counter to zero responsive to determining the code block is a first code block in at least one of a superframe, a sequence of code blocks, or data stream.

10. The method of claim 5, wherein each entry of the look up table includes a value of "1" indicative that the corresponding code block is to be output for further processing or a value of "0" indicative that the corresponding code block is to be dropped.

11. The method of claim 5, wherein referencing the code block with the value of the code block counter includes marking or tagging the code block with the value of the code block counter.

12. The apparatus of claim 1, wherein the code block selector is configured to set the value of the code block counter to zero responsive to determining the code block is a first code block in at least one of a superframe, a sequence of code blocks, or data stream.

13. The apparatus of claim 1, wherein each entry of the look up table includes a value of "1" indicative that the corresponding code block is to be output for further processing or a value of "0" indicative that the corresponding code block is to be dropped.

14. The apparatus of claim 1, wherein the code block selector is configured to reference the code block with the value of the code block counter by marking or tagging the code block with the value of the code block counter.

15. The apparatus of claim 1, wherein 1024 code blocks are to be received in at least one of the superframe, the sequence of code blocks, and the data stream, and
wherein the look up table includes 1024 entries.

* * * * *